(12) United States Patent
Lee et al.

(10) Patent No.: US 11,875,844 B2
(45) Date of Patent: Jan. 16, 2024

(54) STATIC RANDOM ACCESS MEMORY DEVICE

(71) Applicant: Samsung Electronics Co., Ltd., Suwon-si (KR)

(72) Inventors: Inhak Lee, Seoul (KR); Sang-Yeop Baeck, Yongin-si (KR); Younghwan Park, Seoul (KR); Jaesung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 17/577,198

(22) Filed: Jan. 17, 2022

(65) Prior Publication Data

US 2022/0351772 A1 Nov. 3, 2022

(30) Foreign Application Priority Data

May 3, 2021 (KR) .................. 10-2021-0057468

(51) Int. Cl.
*G11C 11/00* (2006.01)
*G11C 11/419* (2006.01)
(Continued)

(52) U.S. Cl.
CPC .......... *G11C 11/419* (2013.01); *G11C 11/412* (2013.01); *G11C 11/418* (2013.01)

(58) Field of Classification Search
CPC . G11C 11/1675; G11C 11/401; G11C 11/403; G11C 11/4078; G11C 13/0004; G11C 15/043; G11C 16/08; G11C 16/10; G11C 16/26; G11C 16/28; G11C 16/3495; G11C 2029/0409; G11C 2029/1204; G11C 2029/4402; G11C 2211/4065; G11C 2213/71; G11C 29/12015; G11C 29/20; G11C 29/26; G11C 29/72; G11C 29/76; G11C 29/787; G11C 29/846; G11C 5/06; G11C 5/143; G11C 5/147; G11C 7/1006; G11C 7/1012; G11C 7/12; G11C 7/14; G11C 7/227; G11C 8/08; H03K 5/00006; H03K 19/018528; H03K 3/0315;
(Continued)

(56) References Cited

U.S. PATENT DOCUMENTS 6,172,935 B1 * 1/2001 Wright ................. G11C 7/1084
365/194
7,733,686 B2 6/2010 Clinton
(Continued)

*Primary Examiner* — Thong Q Le
(74) *Attorney, Agent, or Firm* — Harness, Dickey & Pierce, P.L.C.

(57) ABSTRACT

Disclosed is a static random access memory (SRAM) device. According to example embodiments of the present disclosure, a control logic of the SRAM device may include a tracking circuit connected with metal lines for tracking the number of columns of a memory cell array and the number of rows of the memory cell array. By the tracking circuit, a length of word lines of the memory cell array and a length of bit lines of the memory cell array may be tracked. The control logic of the SRAM device may generate control pulses optimized for the size of the memory cell array, based on a tracking result(s) of the tracking circuit. Accordingly, a power and a time necessary for a write operation and a read operation may be reduced.

20 Claims, 16 Drawing Sheets

(51) Int. Cl.
*G11C 11/412* (2006.01)
*G11C 11/418* (2006.01)

(58) Field of Classification Search
CPC ........ H10B 99/00; H10B 61/20; H10B 63/10; H10B 63/30; G06F 1/3225; G06F 13/1689; G06F 13/1694; G06F 13/4239; G06F 11/1048; G06F 11/1004; G06F 11/1076; G06F 13/1668; G06F 11/1052; G06F 3/0604; G06F 3/0655; G06F 3/0679; G06F 1/04; G06F 1/12; G06F 11/3024; G06F 11/3058; G06F 9/30021; G06F 1/06; G06F 11/073; G06F 11/076; G06F 11/0787; G06F 11/3037; G06F 11/3452; G06F 16/2465; G06F 21/64; G06F 21/78; G06F 2216/03; G06F 9/30032; G06F 12/00; G06F 12/0893; G06F 13/16; G06F 13/4027; G06F 13/4068; G06F 3/0653; G06F 3/0659; G06F 30/392; G06F 9/30036
See application file for complete search history.

(56) References Cited

U.S. PATENT DOCUMENTS

| | | |
|---|---|---|
| 8,284,626 B2 | 10/2012 | Prasad et al. |
| 8,804,438 B2 | 8/2014 | Sharma et al. |
| 8,908,418 B2 | 12/2014 | Yabuuchi |
| 9,030,863 B2 | 5/2015 | Gulati et al. |
| 9,786,363 B1 | 10/2017 | Hong |
| 10,832,764 B2 | 11/2020 | Bhaskaran et al. |
| 10,861,534 B2 | 12/2020 | Goel et al. |

* cited by examiner

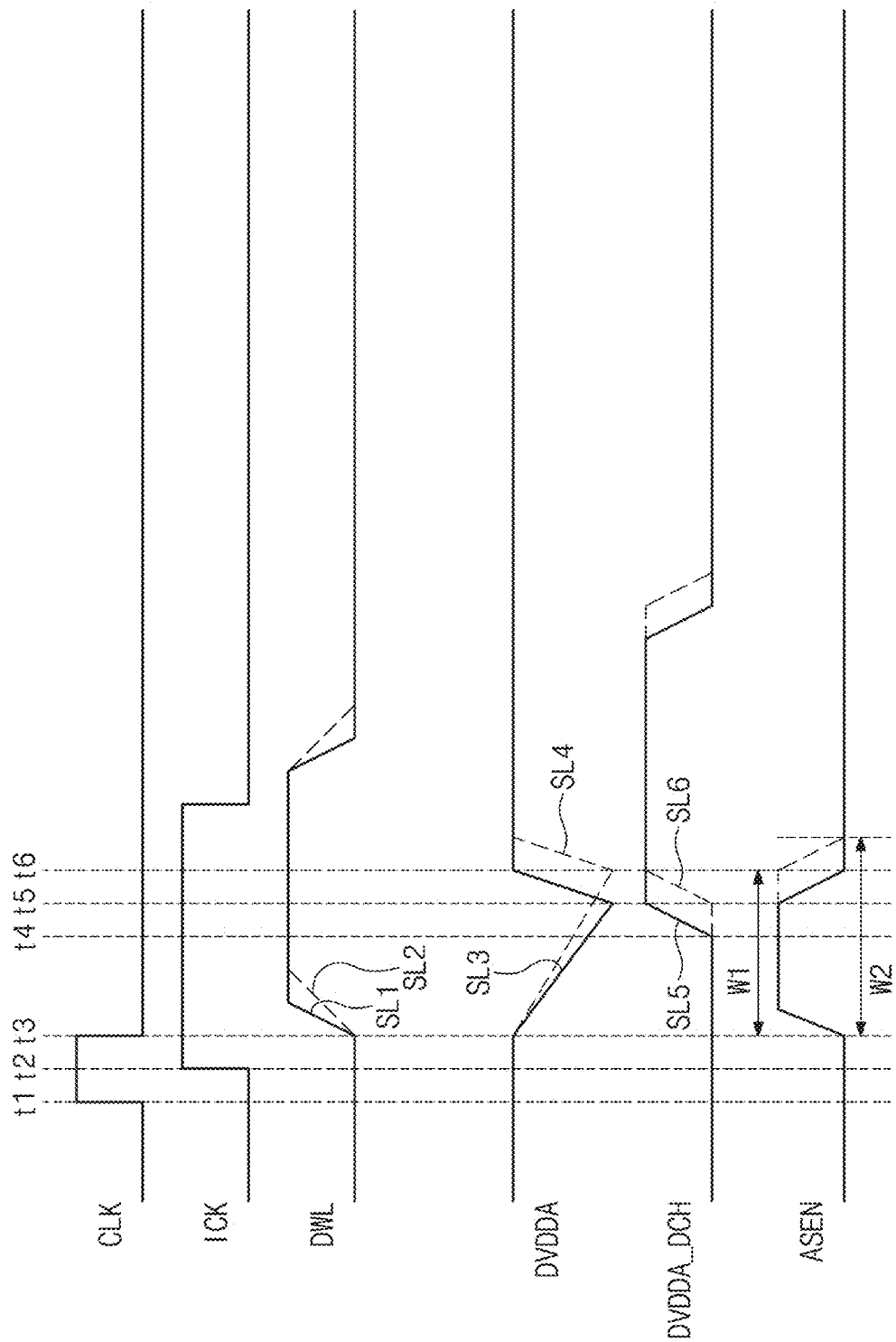

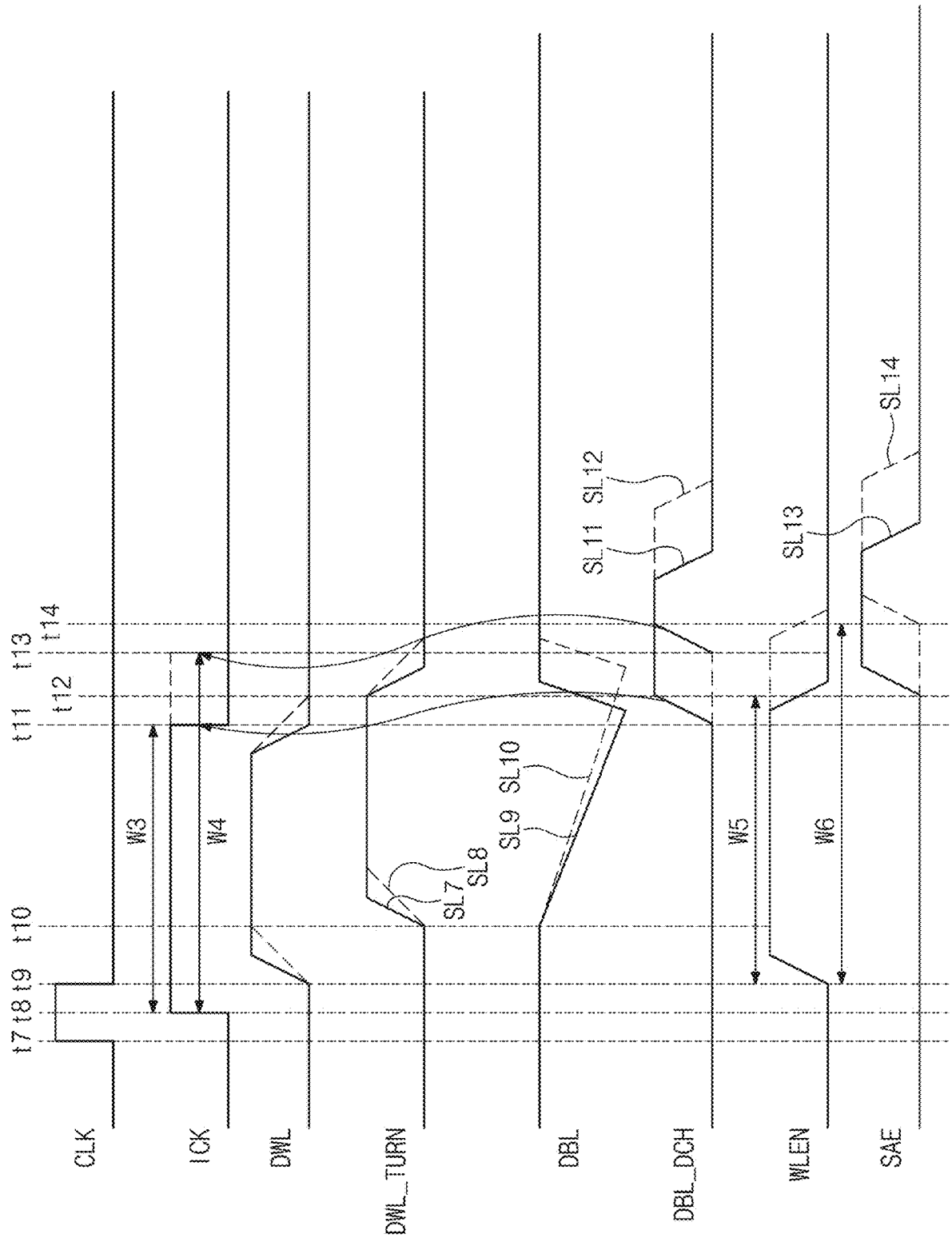

STATIC RANDOM ACCESS MEMORY DEVICE

CROSS-REFERENCE TO RELATED APPLICATIONS

This application claims priority under 35 U.S.C. § 119 to Korean Patent Application No. 10-2021-0057468 filed on May 3, 2021, in the Korean Intellectual Property Office, the disclosures of which are incorporated by reference herein in their entireties.

BACKGROUND

The present disclosure relates to a static random access memory (SRAM) device, and more particularly, relates to an SRAM device generating a pulse to be used therein.

A semiconductor memory device may include a static random access memory (SRAM) that stores data using a latch and a dynamic random access memory (DRAM) that stores data by using a capacitor. Because the integration of the SRAM is difficult compared to the DRAM, a capacity that the SRAM provides in the same area may be small. However, the SRAM may include a peripheral circuit of a simple configuration, may operate at a low power, and may operate at high speed. The SRAM may maintain data without a refresh operation.

The SRAM may include a plurality of bit cells arranged in rows and columns Each of the bit cells may include a plurality of transistors connected with the corresponding word line and the corresponding bit line. To perform various operations such as a write operation and a read operation, control pulses may be applied to a plurality of bit cells, a plurality of word lines, or a plurality of bit lines. A level of a power supply voltage to be supplied to a bit cell, a level of a voltage to be supplied to a word line, or a level of a voltage to be supplied to a bit line may be changed based on the control pulses.

SUMMARY

Example embodiments of the present disclosure provide a static random access memory (SRAM) device tracking the number of rows and the number of columns and generating control pulses based on a tracking result.

According to example embodiments, a memory device may include a memory cell array that includes a plurality of static random access memory cells arranged in rows and columns, a plurality of row decoders that are connected with the plurality of memory cells through a plurality of word lines, a plurality of data input/output circuits that are connected with the plurality of memory cells through a plurality of bit lines, and control logic that includes a clock generator configured to generate an internal clock and a tracking circuit configured to track a number of the rows and a number of the columns based on the internal clock. The tracking circuit may include a driver that is connected with a first wire including a first capacitor corresponding to a length of one of the plurality of word lines and a first resistor corresponding to the length of the one of the plurality of word lines, the driver configured to output a first signal based on a value of the first resistor and a capacitance of the first capacitor, a first inverter that includes a first end connected with a second wire including a second resistor corresponding to a length of one of the plurality of bit lines and a second end connected with a third wire including a second capacitor corresponding to the length of the one of the plurality of bit lines, the first inverter configured to output a second signal based on a value of the second resistor, a capacitance of the second capacitor, and the first signal, and a second inverter configured to output a third signal in response to the second signal. The second wire and the third wire may be identical to a wire through which a power supply voltage is supplied to the plurality of memory cells.

According to example embodiments, a memory device may include a memory cell array that includes a plurality of static random access memory cells arranged in rows and columns, a row decoder that is connected with the plurality of memory cells through a plurality of word lines, a data input/output circuit that is connected with the plurality of memory cells through a plurality of bit lines, and control logic that includes a clock generator configured to generate a first internal clock, a level shifter configured to generate a second internal clock by adjusting a level of the first internal clock, and a tracking circuit configured to track a number of the rows and a number of the columns based on the second internal clock. The tracking circuit may include a driver that is connected with a s and configured to output a first signal based on the second internal clock, a resistance value of the first wire, and a capacitance of the first wire, the first wire having a length corresponding to a length of one of the plurality of word lines, a first inverter that includes a first end connected with a second wire and a second end connected with a third wire and configured to output a second signal based on a resistance value of the second wire, a capacitance of the third wire, and the first signal, the second wire having a length corresponding to a length of one of the plurality of bit lines, and the third wire having a length corresponding to the length of the one of the plurality of bit lines, and a second inverter configured to output a third signal in response to the second signal. The second wire and the third wire may be identical to the plurality of bit lines connected with the plurality of memory cells.

According to example embodiments, an SRAM device may include a memory cell array that includes a plurality of memory cells arranged in rows and columns, wherein each of the plurality of memory cells is connected with one of a plurality of word lines and one of a plurality of bit lines, and control logic that includes a clock generator configured to generate a first internal clock, a first tracking circuit configured to track a number of the rows and a number of the columns based on the first internal clock and generating a first signal, and a second tracking circuit tracking the number of the rows and the number of the columns based on the first internal clock and generate a second signal. The first tracking circuit may include a first wire including a first capacitor corresponding to a length of the memory cells in a column direction, a second wire including a first resistor corresponding to the length of the memory cells in the column direction, and a third wire including a second capacitor and a second resistor each corresponding to a length of the memory cells in a row direction, the first wire and the second wire may be identical to a wire through which a power supply voltage is supplied to the plurality of memory cells, and the control logic may be configured to generate a pulse for controlling a write operation of the SRAM device based on the first signal and generate a pulse for controlling a read operation of the SRAM device based on the second signal.

BRIEF DESCRIPTION OF THE FIGURES

The above and other objects and features of the present disclosure will become apparent by describing in detail example embodiments thereof with reference to the accompanying drawings.

FIG. 4 illustrates a timing diagram of signals generated by control logic of FIG. 2, according to some example embodiments of the present disclosure.

FIG. 7 illustrates a timing diagram of signals generated by control logic of FIG. 5, according to some example embodiments of the present disclosure.

DETAILED DESCRIPTION

Below, example embodiments of the present disclosure will be described in detail and clearly to such an extent that one skilled in the art easily carries out the present disclosure.

Hereinafter, example embodiments of the present disclosure will be described in more detail with reference to accompanying drawings. In describing the present disclosure, to make the overall understanding easy, like components/elements will be marked by like reference signs/numerals in drawings, and thus, additional description will be omitted to avoid redundancy.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1:
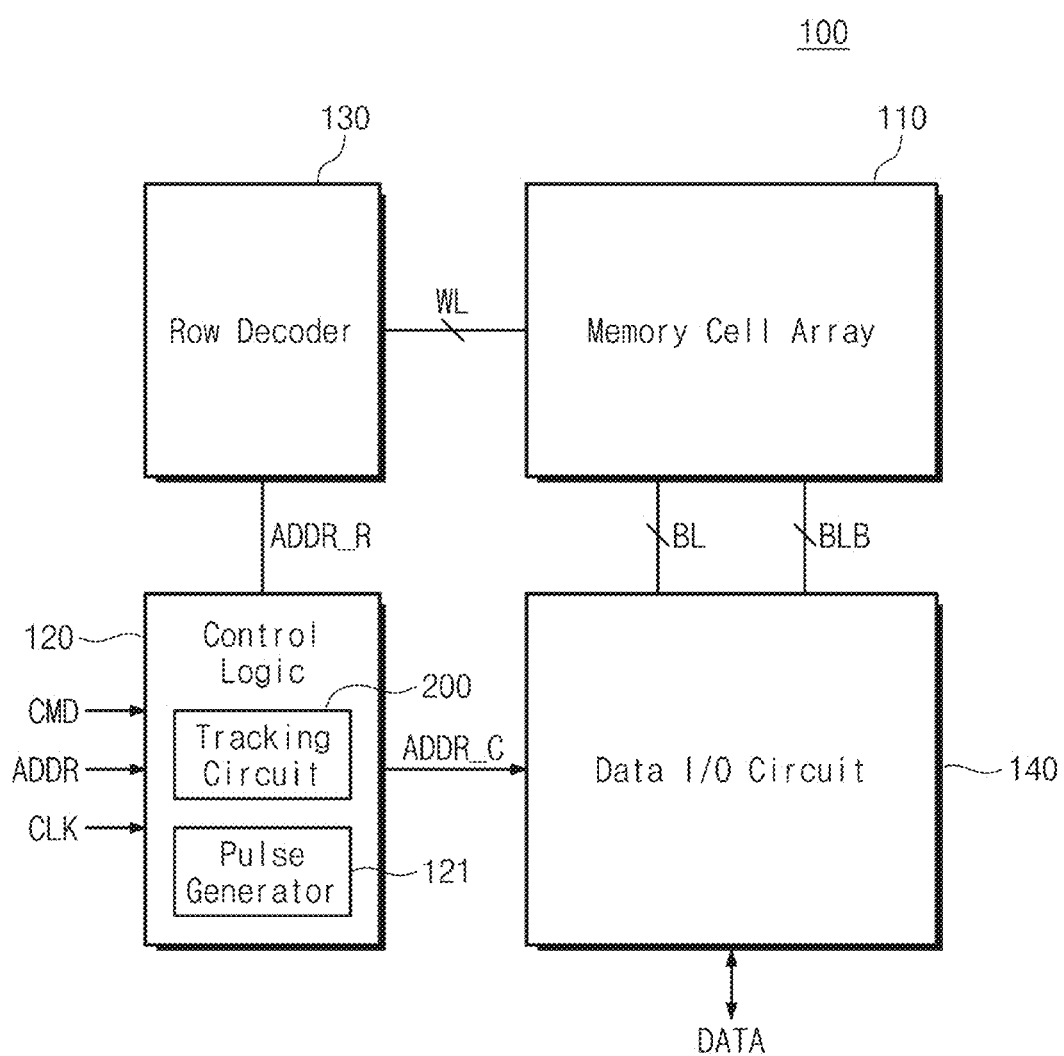
FIG. 1 illustrates a block diagram of a memory device, according to some example embodiments of the present disclosure.

FIG. 1 illustrates a block diagram of a memory device 100 according to some example embodiments of the present disclosure. Referring to FIG. 1, the memory device 100 may include a memory cell array 110, control logic 120, a row decoder 130, and/or a data input/output circuit 140. In some example embodiments, the memory device 100 may be implemented as a static random access memory (SRAM), but the present disclosure is not limited thereto. For example, the memory device 100 may be implemented as one of various memory devices such as a dynamic random access memory (DRAM), a NAND flash memory, a NOR flash memory, a resistive random access memory (RRAM), a ferroelectric random access memory (FRAM), a phase change random access memory (PRAM), and/or a magnetic random access memory (MRAM), etc.

The memory cell array 110 may include a plurality of memory cells (e.g., memory cells CELL of FIG. 2) storing data. The plurality of memory cells included in the memory cell array 110 may be respectively disposed at intersections of a plurality of word lines WL and a plurality of bit lines BL. For example, each, or one or more, of the memory cells may be connected with the corresponding word line of the plurality of word lines WL. Each, or one or more, of the memory cells may be connected with the corresponding bit line among the plurality of bit lines BL and the corresponding complementary bit line among a plurality of complementary bit lines BLB. The plurality of word lines WL may be connected with the rows of memory cells, and the plurality of bit lines BL and the plurality of complementary bit lines BLB may be connected with the columns of memory cells.

The control logic 120 may receive a command CMD, an address ADDR, and a clock CLK from an external device (e.g., a host, a central processing unit (CPU), or a memory controller) of the memory device 100. The command CMD may be an instruction (or a command) indicating an operation to be performed by the memory device 100. The address ADDR may include a row address ADDR_R and a column address ADDR_C associated with a row and a column of a memory cell targeted for an operation to be performed by the memory device 100. The control logic 120 may control an operation of the memory device 100 based on the clock CLK received from the external device. The control logic 120 may provide the row address ADDR_R to the row decoder 130 and may provide the column address ADDR_C to a column decoder (not illustrated) of the data input/output circuit 140.

The control logic 120 may include a pulse generator 121 and/or a tracking circuit 200. The control logic 120 may further include a decoder (not illustrated) for decoding the received command CMD. The control logic 120 may decode the command CMD. In response to a decoding result, the pulse generator 121 may generate various control signals that are used in the memory device 100.

The tracking circuit 200 may track a capacitance and a resistance corresponding to the rows of the memory cell array 110 and a capacitance and a resistance corresponding to the columns of the memory cell array 110. For example, the tracking circuit 200 may track a capacitance and a resistance corresponding to at least a part of the rows of the memory cell array 110 (or at least a part of a length of a bit line of the memory cell array 110). The tracking circuit 200 may track a capacitance and a resistance corresponding to at least a part of the columns of the memory cell array 110 (or at least a part of a length of a word line of the memory cell array 110).

In some example embodiments, further in response to the tracking of the tracking circuit 200, the pulse generator 121 may generate the control signals that are used in the memory device 100. For example, based on a tracking result of the tracking circuit 200, the pulse generator 121 may generate a write assist pulse (e.g., ASEN of FIG. 4) for adjusting a level of a power supply voltage that is applied to memory cells of the memory cell array 110 when a write operation is performed. As such, a width of the write assist pulse may be determined based on the number of columns of the memory cell array 110 and the number of rows of the memory cell array 110.

For another example, based on the tracking result of the tracking circuit 200, the pulse generator 121 may generate a word line enable pulse (e.g., WLEN of FIG. 7) for adjusting a level of a voltage to be applied to a word line selected from the word lines WL and a sense amplifier enable pulse (e.g., SAE of FIG. 7) for controlling an operation of the data input/output circuit 140, when a read operation is performed. As such, a width of the word line enable pulse and a timing of the sense amplifier enable pulse may be determined based on the number of columns of the memory cell array 110 and the number of rows of the memory cell array 110. An operation of the control logic 120 including the tracking circuit 200 will be described in detail later.

The row decoder 130 may be connected with the memory cell array 110 through the plurality of word lines WL. The row decoder 130 may receive the row address ADDR_R from the control logic 120. The row decoder 130 may decode the received row address ADDR_R and may select one of the plurality of word lines WL connected with the memory cell array 110 in response to a decoding result. The row decoder 130 may activate the selected word line by applying a voltage to the selected word line.

The data input/output circuit 140 may be connected with the memory cell array 110 through the plurality of bit lines BL and the plurality of complementary bit lines BLB. The data input/output circuit 140 may include the column decoder, sense amplifiers for sensing and amplifying data stored in the memory cell array 110, latches for storing data output from the memory cell array 110, and/or a write driver for writing data to the memory cell array 110, etc.

The data input/output circuit 140 may receive the column address ADDR_C from the control logic 120. The column decoder of the data input/output circuit 140 may decode the column address ADDR_C, and may activate a bit line(s) and a complementary bit line(s) corresponding to the column address ADDR_C from among the plurality of bit lines BL and the plurality of complementary bit lines BLB connected with the memory cell array 110 in response to a decoding result. For example, the column decoder may activate the selected bit line(s) and complementary bit line(s) by applying a voltage to the selected bit line(s) and complementary bit line(s) corresponding to the column address ADDR_C.

When the memory device 100 performs the write operation in response to the command CMD and the address ADDR, the data input/output circuit 140 may receive data "DATA" from the external device. An input/output buffer (not illustrated) of the data input/output circuit 140 may temporarily store the received data "DATA". The data "DATA" temporarily stored in the input/output buffer may be written to the memory cell array 110 through the write driver (not illustrated) of the data input/output circuit 140.

When the memory device 100 performs the read operation in response to the command CMD and the address ADDR, the sense amplifiers (not illustrated) of the data input/output circuit 140 may sense data stored in the memory cell array 110, and the input/output buffer of the data input/output circuit 140 may temporarily store the data sensed by the sense amplifiers. The data that are temporarily stored in the input/output buffer after read from the memory cell array 110 may be output to the external device as the data "DATA", in response to a request of the external device.

Figure 2:
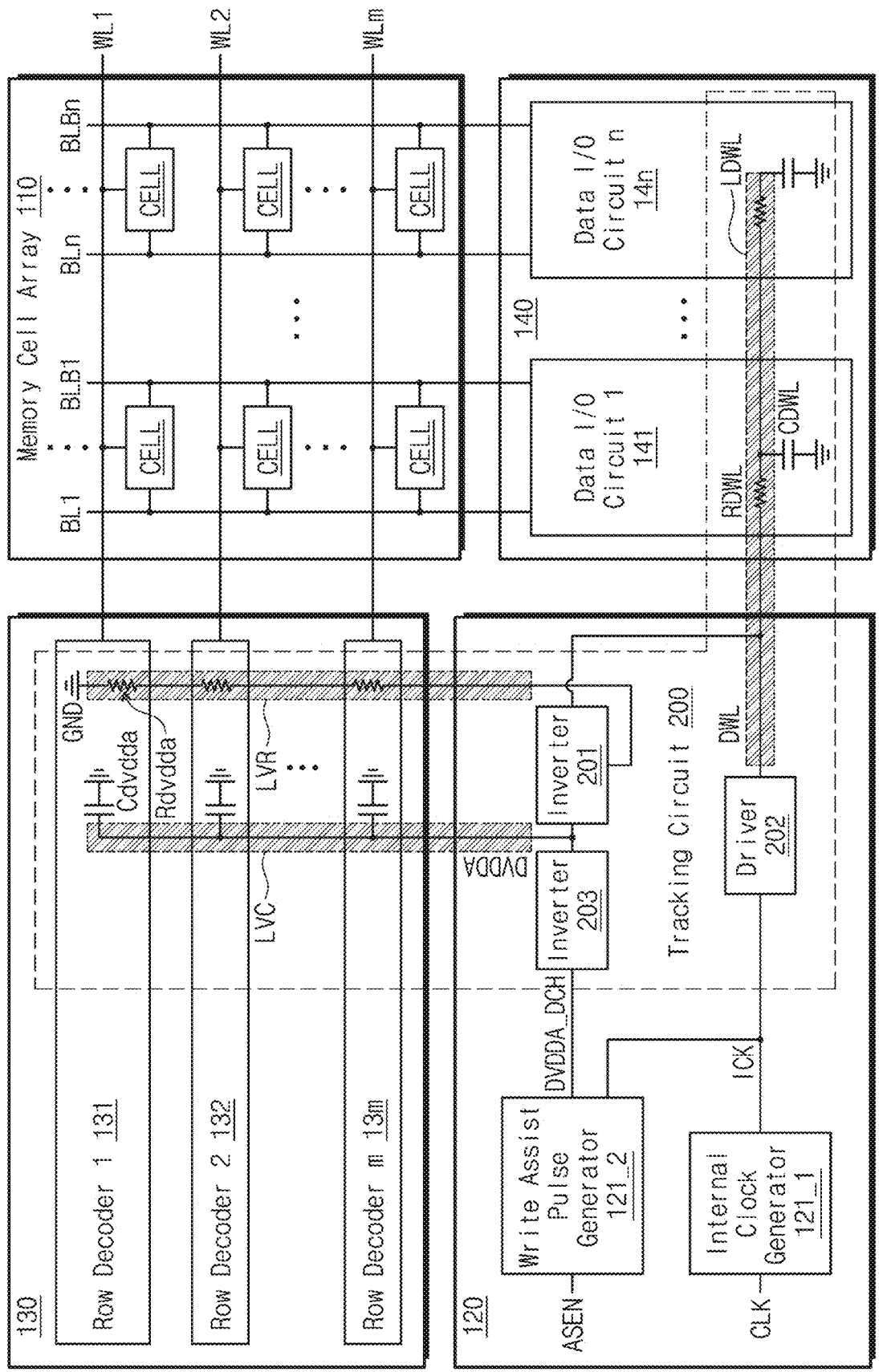
FIG. 2 illustrates control logic including a tracking circuit in more detail, according to some example embodiments of the present disclosure.

FIG. 2 illustrates the control logic 120 including the tracking circuit 200 in more detail, according to some example embodiments of the present disclosure. Referring to FIGS. 1 and 2, the control logic 120 may further include an internal clock generator 121_1 and/or a write assist pulse generator 121_2. The internal clock generator 121_1 and/or the write assist pulse generator 121_2 may be included in the pulse generator 121 of FIG. 1. The row decoder 130 may include first to m-th row decoders 131 to 13m (m being a natural number), and/or the data input/output circuit 140 may include first to n-th data input/output circuits 141 to 14n (n being a natural number). The memory cell array 110 may include the memory cells CELL each, or one or more, of which is connected with one of bit lines BL1 to BLn, one of complementary bit lines BLB1 to BLBn, and/or one of word lines WL1 to WLm.

In some example embodiments, each, or one or more, of the memory cells CELL may include a plurality of transistors for storing data. For example, one memory cell may include transistors for storing 1-bit data and transistors for accessing data stored therein. One memory cell may include 6 transistors or 8 transistors, but the present disclosure is not limited thereto.

The first to m-th row decoders 131 to 13m may be connected with the first to m-th word lines WL1 to WLm, respectively. Under control of the control logic 120, each, or one or more, of the first to m-th row decoders 131 to 13m may activate the corresponding word line. Unlike the example illustrated in FIG. 2, each, or one or more, of the first to m-th row decoders 131 to 13m may be connected with one or more word lines (or may correspond to one or more word lines). For example, the first row decoder 131 may be connected with four word lines. Under control of the control logic 120, the first row decoder 131 may activate one of the four word lines.

The first to n-th data input/output circuits 141 to 14*n* may be connected with the first to n-th bit lines BL1 to BLn and the first to n-th complementary bit lines BLB1 to BLBn. Under control of the control logic 120, each, or one or more, of the first to n-th data input/output circuits 141 to 14*n* may sense data stored in memory cells connected with the corresponding bit line and the corresponding complementary bit line from among the memory cells CELL and may output the sensed data.

The internal clock generator 121_1 may generate an internal clock ICK to be used in the memory device 100, based on the clock CLK received from the external device. For example, the internal clock generator 121_1 may provide the internal clock ICK to the write assist pulse generator 121_2 and the tracking circuit 200.

The write assist pulse generator 121_2 may generate a write assist pulse ASEN in response to the internal clock ICK generated from the internal clock generator 121_1 and/or a tracking result of the tracking circuit 200. For example, a width of the write assist pulse ASEN generated by the write assist pulse generator 121_2 may vary depending on a signal DVDDA_DCH generated by the tracking circuit 200. How the write assist pulse ASEN is generated will be described in detail later.

The tracking circuit 200 may include wires LVC, LVR, and/or LDWL, inverters 201 and/or 203, and/or a driver 202. The tracking circuit 200 may include the wires LVC and/or LVR for tracking the number of rows of the memory cell array 110. In some example embodiments, the wires LVC and/or LVR may be implemented with dummy wires having a length corresponding to (e.g., substantially equal to) that of a wire (e.g., a metal line) through which a power supply voltage is supplied to the memory cells CELL of the memory cell array 110. The wire LVR may have a resistance (or a resistor(s)) corresponding to (e.g., equal to) that of the wire through which the power supply voltage is supplied. For example, the wires LVR and/or LVC may be understood as a wire implemented by modeling the wire through which the power supply voltage is supplied.

The wire LVR may include resistors Rdvdda, and a total resistance of the wire LVR may be substantially equal to a resistance of the wire through which the power supply voltage is supplied. The wire LVC may be implemented with a dummy wire having a length corresponding to (e.g., substantially equal to) that of the wire (e.g., a metal line) through which the power supply voltage is supplied to the memory cells CELL of the memory cell array 110. The wire LVC may include capacitors Cdvdda. A total capacitance of the capacitors Cdvdda (e.g., a total capacitance of the wire LVC) may be a self-capacitance of the wire LVC or a capacitance of the wire LVC and wires around a dummy wire. A total capacitance of the wire LVC may correspond to a self-capacitance of the wire through which the power supply voltage is supplied or a capacitance of surrounding wires and the wire through which the power supply voltage is supplied. For example, capacitances of the respective capacitors Cdvdda may be capacitances respectively corresponding to the first to m-th row decoders 131 to 13*m* of the row decoder 130. Values of the resistors Rdvdda may be values of resistors respectively corresponding to the first to m-th row decoders 131 to 13*m*.

A total capacitance of the capacitors Cdvdda and a total resistance "R" of the resistors Rdvdda may vary depending on the number of rows of the memory cell array 110. For example, as the number of rows of the memory cell array 110 increases (e.g., a length of the bit lines BL and the complementary bit lines BLB connected with the memory cell array 110 increases or as the number of word lines connected with the memory cell array 110 increases), a total capacitance of the capacitors Cdvdda may increase, and the total resistance "R" may increase.

The tracking circuit 200 may include the wire LDWL for tracking the number of columns of the memory cell array 110. The wire LDWL may include capacitors CDWL and resistors RDWL. In some example embodiments, a total capacitance of the capacitors CDWL may correspond to that of a dummy word line in the memory cell array 110. A total resistance of the resistors RDWL may correspond to that of the dummy word line in the memory cell array 110.

In some example embodiments, the wire LDWL may be implemented with a wire having a length corresponding to (e.g., substantially equal to) that of the word lines WL and/or dummy word lines connected with the memory cell array 110, based on a process and a material corresponding to (e.g., substantially identical) to those of the word lines WL or the dummy word lines. For example, the wire LDWL may correspond to a wire obtained by modeling the word lines WL and/or the dummy word lines. The wire LDWL may have a resistance corresponding to (e.g., substantially equal to) that of the word lines WL or the dummy word lines. A self-capacitance of the wire LDWL and/or a capacitance of the wire LDWL and/or wires around the wire LDWL may correspond to (e.g., substantially equal to) a self-capacitance of the word lines WL and/or the dummy word lines and/or a capacitance of the word lines WL and/or the dummy word lines and surrounding wires.

In some example embodiments, the wire LDWL may be located outside the memory cell array 110. For example, the wire LDWL may be located in the data input/output circuit 140.

In some example embodiments, unlike the example illustrated in FIG. 2, the wire LDWL may be located within the memory cell array 110. For example, the wire LDWL may be one of the dummy word lines of the memory cell array 110.

A total capacitance of the capacitors CDWL and a total resistance of the resistors RDWL may vary depending on the number of columns of the memory cell array 110. For example, as the number of columns of the memory cell array 110 increases (e.g., a length of the word lines WL connected with the memory cell array 110 increases or as the number of bit lines BL connected with the memory cell array 110 increases), a total capacitance of the capacitors CDWL may increase, and a total resistance of the resistors RDWL may increase.

The inverter 201 may be connected with the resistors Rdvdda, the driver 202, and/or the inverter 203. In response to a signal DWL from the driver 202, the inverter 201 may output a signal DVDDA to the inverter 203, based on a magnitude of the total resistance "R" and a magnitude of the total capacitance of the capacitors Cdvdda. The inverter 201 may be referred to as a "driver".

The driver 202 may receive the internal clock ICK from the internal clock generator 121_1. In response to the internal clock ICK, the driver 202 may generate the signal DWL, based on a magnitude of a total capacitance of the capacitors CDWL and a magnitude of a total resistance of the resistors RDWL. The driver 202 may provide the signal DWL to the inverter 201.

The inverter 203 may output the signal DVDDA_DCH to the write assist pulse generator 121_2 in response to the signal DVDDA from the inverter 201. For example, the inverter 203 may invert and/or delay the signal DVDDA.

The driver 202 of the tracking circuit 200 may track the number of columns of the memory cell array 110 (or the number of bit lines BL thereof), and the inverter 201 may track the number of rows of the memory cell array 110 (or the number of word lines WL thereof). The inverter 201 may track both a capacitance and a resistance corresponding to the number of rows of the memory cell array 110. A tracking result of the driver 202 and a tracking result of the inverter 201 may be provided to the write assist pulse generator 121_2 through the inverter 203. The write assist pulse generator 121_2 may adjust a width of the write assist pulse ASEN, based on the tracking results.

The write assist pulse ASEN may be a pulse for adjusting a level of the power supply voltage to be supplied to the memory cells CELL of the memory cell array 110 when the write operation is performed by the memory device 100. For example, in response to the write assist pulse ASEN of logical high, the level of the power supply voltage to be supplied to the memory cells CELL may decrease.

A width of the write assist pulse ASEN may be determined based on the number of rows of the memory cell array 110 and the number of columns of the memory cell array 110. For example, as the number of columns of the memory cell array 110 decreases, and/or as a ratio of the number of columns of the memory cell array 110 to the number of rows of the memory cell array 110 decreases, a width of the write assist pulse ASEN may decrease. In response to the width of the write assist pulse ASEN thus decreased, the level of the power supply voltage to be supplied to the memory cells CELL may less decrease. As the level of the power supply voltage to be supplied to the memory cells CELL is reduced or prevented from unnecessarily decreasing, power consumption may be reduced, and a write margin may be improved.

Figure 3A:
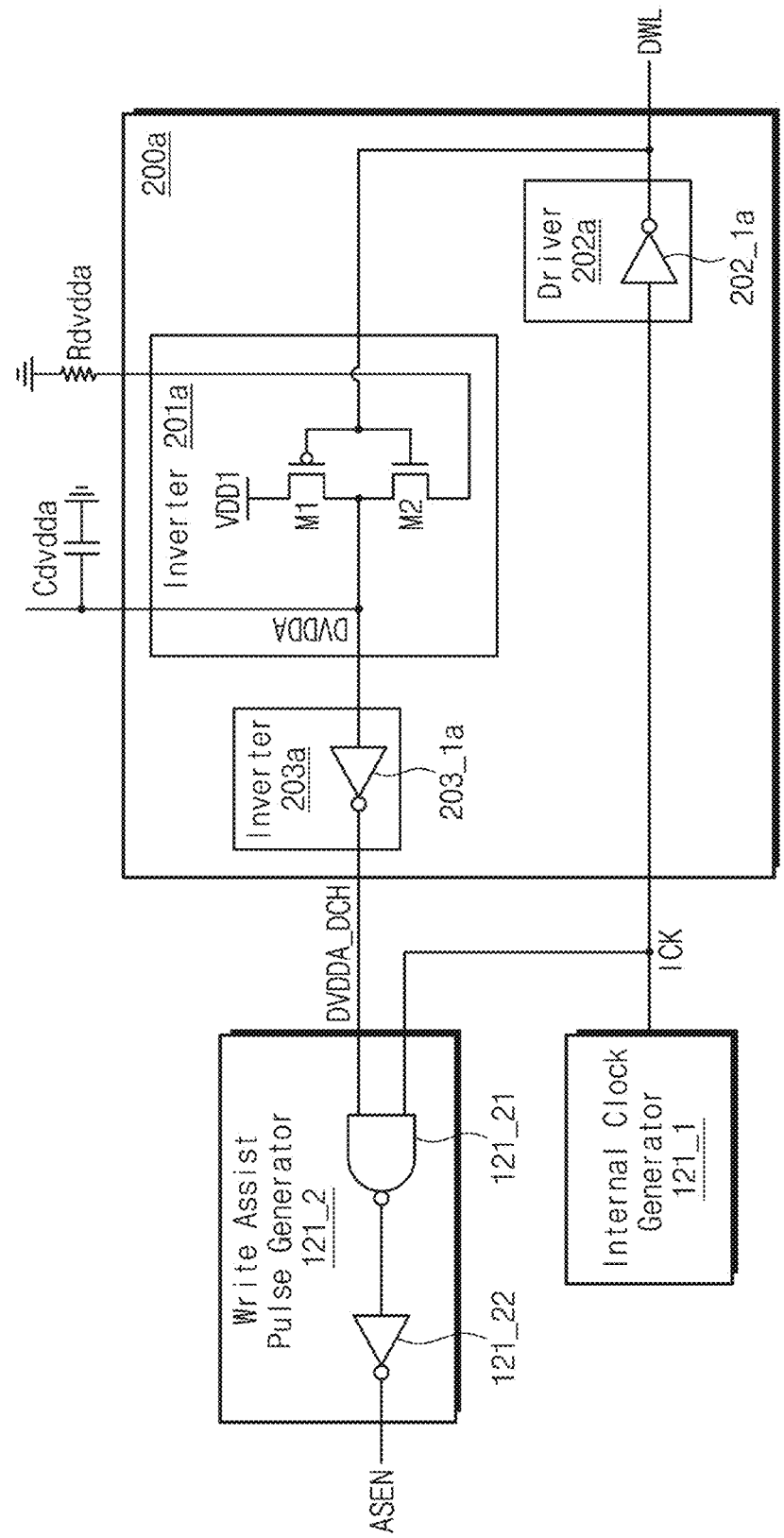
FIG. 3A illustrates a circuit diagram of a tracking circuit, according to some example embodiments of the present disclosure.

FIG. 3A illustrates a circuit diagram of a tracking circuit 200a, according to some example embodiments of the present disclosure. Referring to FIGS. 1, 2, and 3A, the tracking circuit 200a may include inverters 201a and 203a and a driver 202a.

The inverter 201a may include transistors M1 and/or M2. In some example embodiments, the transistor M1 may be implemented as a PMOS transistor, and/or the transistor M2 may be implemented as an NMOS transistor.

The transistor M1 may include a first end (e.g., a source) to which a voltage VDD1 is applied, a gate connected with a gate of the transistor M2, and/or a second end (e.g., a drain) connected with a first end of the transistor M2. The gate of the transistor M1 may be connected with an output terminal of the driver 202a. The signal DWL may be applied to the gate of the transistor M1. A capacitance corresponding to the power supply voltage to be supplied to the memory cells CELL may be applied to the second end of the transistor M1 through the signal DVDDA.

The transistor M2 may include the first end (e.g., a drain) connected with the second end of the transistor M1, a gate connected with the gate of the transistor M1, and/or a second end (e.g., a source) connected with the total resistance "R". The signal DWL may be applied to the gate of the transistor M2. The second end of the transistor M2 may be connected with a ground terminal through the resistors Rdvdda.

As the second end of the transistor M2 is connected with the ground terminal through the wire LVR, a resistance corresponding to that of the wire through which the power supply voltage is supplied to the memory cells CELL of the memory cell array 110 may be tracked by the inverter 201a. As the inverter 201a tracks not only a capacitance (e.g., a total capacitance of the capacitors Cdvdda) corresponding to that of the wire through which the power supply voltage is supplied to the memory cells CELL of the memory cell array 110 but also a resistance corresponding to that of the wire through which the power supply voltage is supplied to the memory cells CELL of the memory cell array 110, a pulse width of the write assist pulse ASEN may be improved or optimized. As such, the amount of drop responding to the write assist pulse ASEN of the power supply voltage that is supplied to the memory cells CELL may be improved or optimized. For example, in response to the write assist pulse ASEN of logical high, the power supply voltage supplied to the memory cells CELL may not excessively decrease.

The driver 202a may include an inverter 202_1a. The inverter 202_1a may include an input terminal of receiving the internal clock ICK generated from the internal clock generator 121_1 and an output terminal of outputting the signal DWL. The inverter 202_1a may output the signal DWL in response to the internal clock ICK and the number of columns of the memory cell array 110. The inverter 202_1a may output the signal DWL to the gate of the transistor M1 and/or the gate of the transistor M2.

Each, or one or more, of the transistor M1 and the transistor M2 may be turned on or turned off in response to the signal DWL. In response to the signal DWL, the inverter 201a may output, to the inverter 203a, the signal DVDDA that is based on values of a capacitance of the wire LVC and a resistance of the wire LVR.

The inverter 203a may include an inverter 203_1a. The inverter 203_1a may invert the signal DVDDA. The inverter 203_1a may output the signal DVDDA_DCH to the write assist pulse generator 121_2.

The write assist pulse generator 121_2 may include a NAND gate 121_21 and/or an inverter 121_22. The NAND gate 121_21 may include a first input terminal of receiving the signal DVDDA_DCH from the inverter 203a of the tracking circuit 200a and/or a second input terminal of receiving the internal clock ICK from the internal clock generator 121_1. The NAND gate 121_21 may perform a NAND operation on the signal DVDDA_DCH and the internal clock ICK. The NAND gate 121_21 may output a result of the NAND operation to the inverter 121_22. The inverter 121_22 may invert the result of the NAND operation. The inverter 121_22 may output the inverted result of the NAND operation as the write assist pulse ASEN.

Figure 3B:
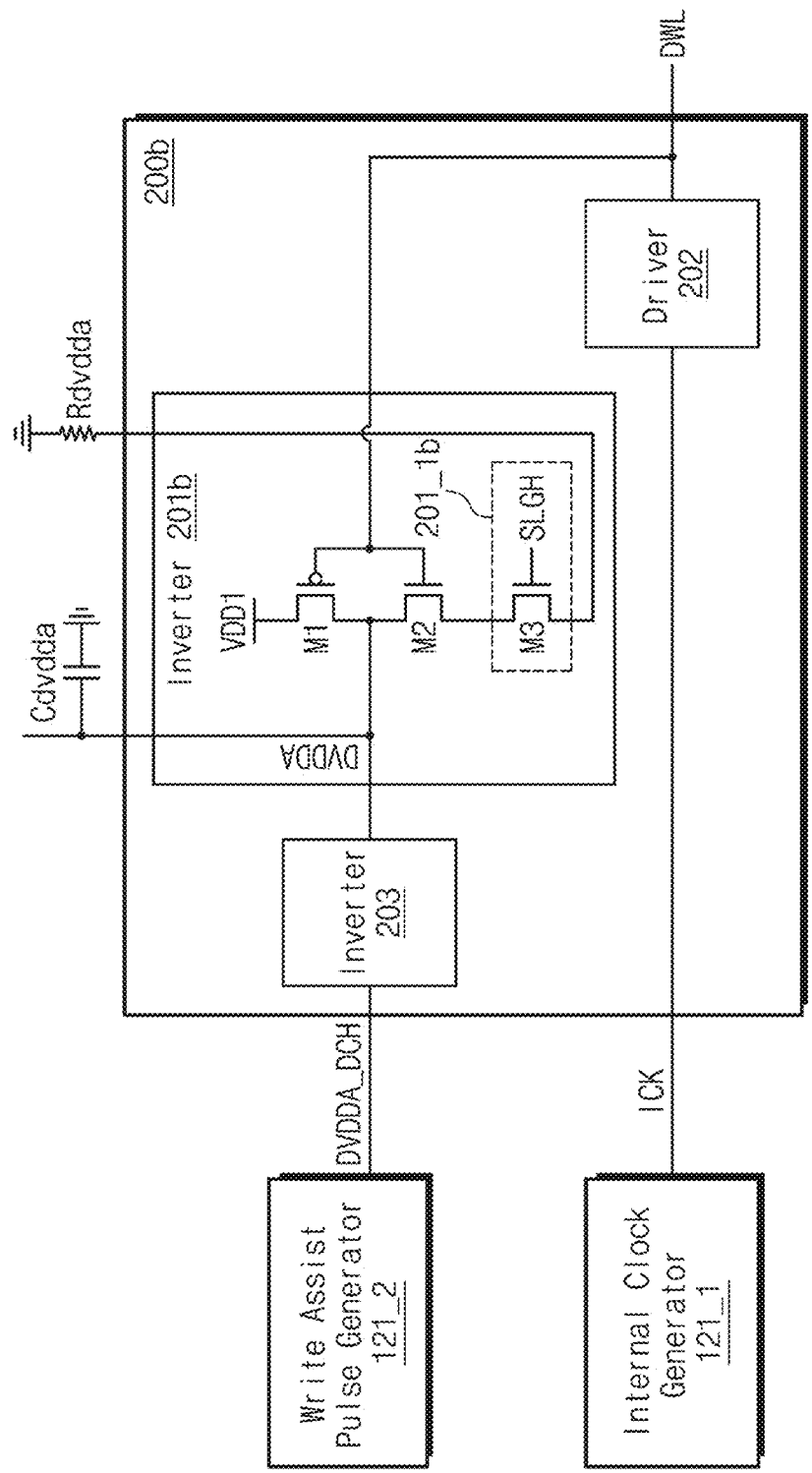
FIG. 3B illustrates a circuit diagram of a tracking circuit, according to some example embodiments of the present disclosure.

FIG. 3B illustrates a circuit diagram of a tracking circuit 200b, according to some example embodiments of the present disclosure. Referring to FIGS. 1, 2, 3A, and 3B, the tracking circuit 200b may include inverters 201b and 203 and/or the driver 202.

Unlike the inverter 201a of FIG. 3A, the inverter 201b of FIG. 3B may further include a stack 201_1b. The stack 201_1b may include one or more transistors (e.g., one or more NMOS transistors). In example embodiments illustrated in FIG. 3B, the stack 201_1b may include one transistor M3, but the number of transistors included in the stack 201_1b is not limited thereto.

The stack 201_1b may be connected with the second end of the transistor M2. The second end of the transistor M2 may be connected with the resistors Rdvdda of the wire LVR through the stack 201_1b. The stack 201_1b may include the transistor M3, and the transistor M3 may be implemented with an NMOS transistor.

The transistor M3 may include a first end (e.g., a drain) connected with the second end of the transistor M2, a gate to which a signal SLGH is applied, and/or a second end (e.g., a source) connected with the ground terminal through the resistors Rdvdda of the wire LVR. The signal SLGH may be a signal that is always at logical high (e.g., logic "1"). As such, the transistor M3 may be always turned on. In some example embodiments, the signal SLGH may be generated from the pulse generator 121 of the control logic 120.

As the inverter 201b further includes the stack 201_1b, a total intensity of NMOS transistors included in the inverter 201b may be adjusted. As the inverter 201b further includes the NMOS transistor being always turned on, a total intensity of NMOS transistors included in the inverter 201b may be adjusted. For another example, a size of a channel that is formed at the transistor M3 may vary depending on a level of the signal SLGH. As such, a magnitude of a current that flows through the transistor M2 when the transistor M2 is turned on may also be variable. According to the above description, a timing when the inverter 201b outputs the signal DVDDA in response to the signal DWL may change. This may mean that a timing of the write assist pulse ASEN is adjusted.

Figure 3C:
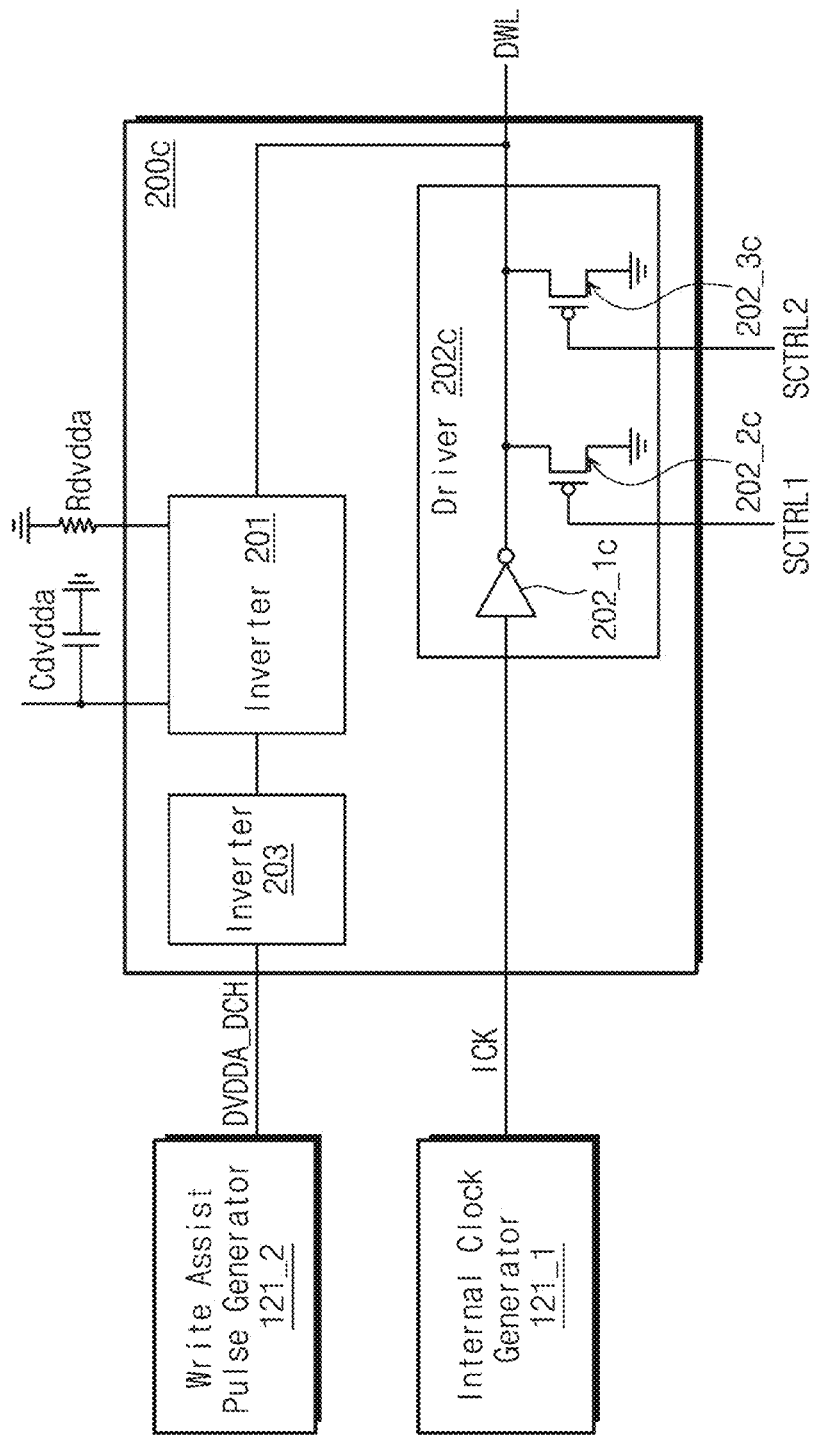
FIG. 3C illustrates a circuit diagram of a tracking circuit, according to some example embodiments of the present disclosure.

FIG. 3C illustrates a circuit diagram of a tracking circuit 200c, according to some example embodiments of the present disclosure. Referring to FIGS. 1, 2, 3A, and 3C, the tracking circuit 200c may include the inverters 201 and 203 and a driver 202c.

Unlike the driver 202a of FIG. 3A, the driver 202c of FIG. 3C may include an inverter 202_1c and/or transistors 202_2c and/or 202_3c. The inverter 202_1c may receive the internal clock ICK from the internal clock generator 121_1. The inverter 202_1c may invert the internal clock ICK. The inverter 202_1c may output the signal DWL in response to the internal clock ICK, the capacitors CDWL, and/or the resistors RDWL.

The transistor 202_2c may include a first end (e.g., a source) connected with an output terminal of the inverter 202_1c, a gate to which a signal SCTRL1 is applied, and/or a second end (e.g., a drain) connected with the ground terminal. The transistor 202_3c may include a first end (e.g., a source) connected with the output terminal of the inverter 202_1c, a gate to which a signal SCTRL2 is applied, and/or a second end (e.g., a drain) connected with the ground terminal. In some example embodiments, the transistors 202_2c and 202_3c may be implemented as a PMOS transistor. In some example embodiments, the signal SCTRL1 and/or the signal SCTRL2 may be generated from the pulse generator 121 of the control logic 120.

The transistor 202_2c may be turned on and/or turned off in response to the signal SCTRL1. The transistor 202_3c may be turned on and/or turned off in response to the signal SCTRL2. As the transistors 202_2c and 202_3c are turned on and/or turned off, a maximum level of the signal DWL may be adjusted. For example, a maximum level of the signal DWL when all the transistors 202_2c and 202_3c are turned off may be higher than a maximum level of the signal DWL when one of the transistors 202_2c and 202_3c is turned on. As a maximum level of the signal DWL is adjusted, a level of a gate voltage that is applied to transistors (e.g., M1 and M2 of FIG. 3A) in the inverter 201 may be adjusted. As such, an intensity of the transistors in the inverter 201 may be adjusted.

The number of transistors 202_2c and 202_3c included in the driver 202c is not limited to the example illustrated in FIG. 3C. For example, the driver 202c may further include transistors connected in parallel with the transistors 202_2c and 202_3c. For another example, the driver 202c may include only the transistor 202_2c.

Figure 3D:
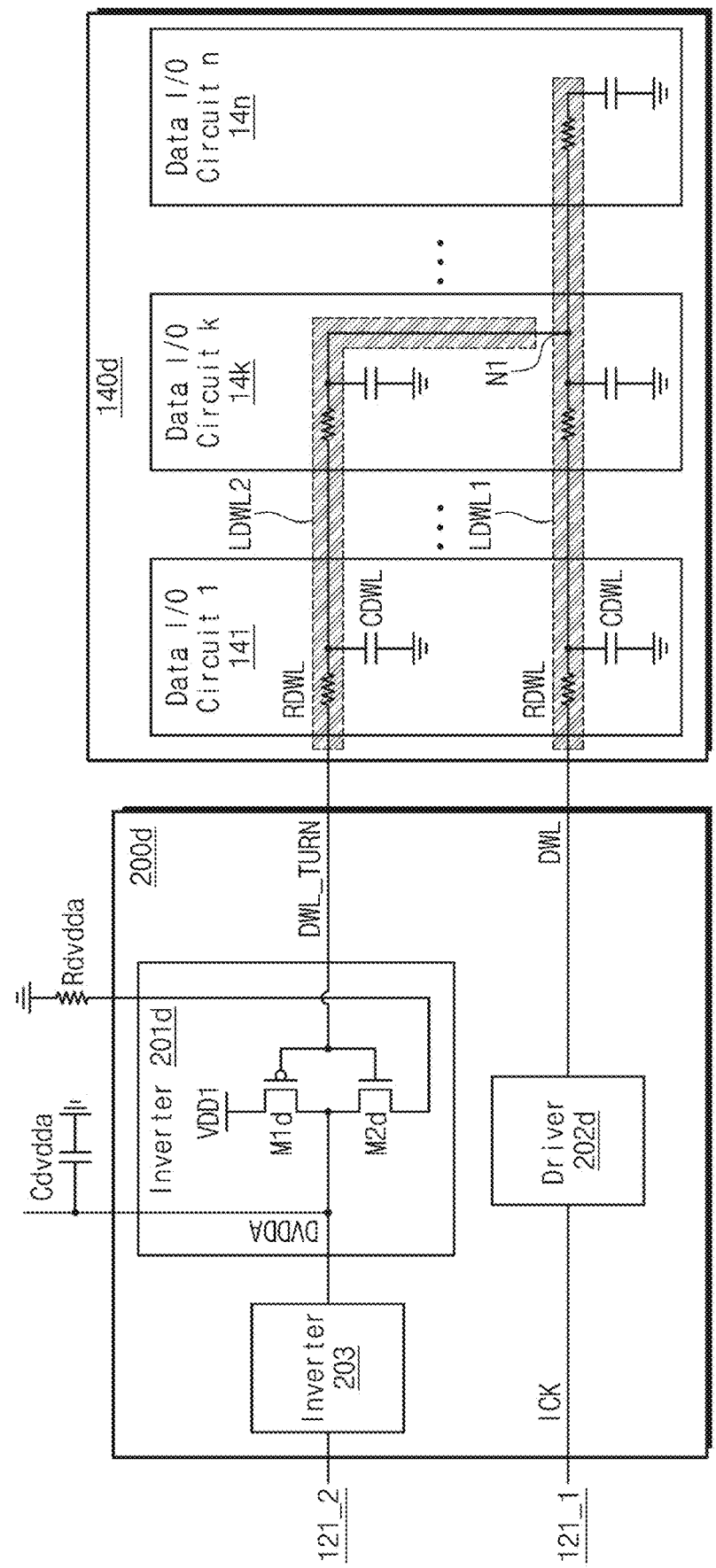
FIG. 3D illustrates a circuit diagram of a tracking circuit, according to some example embodiments of the present disclosure.

FIG. 3D illustrates a circuit diagram of a tracking circuit 200d, according to some example embodiments of the present disclosure. Referring to FIGS. 1, 2, 3A, and 3D, the tracking circuit 200d may include inverters 201d and/or 203 and/or the driver 202.

Unlike the tracking circuit 200 of FIG. 2, the tracking circuit 200d may include two wires LDWL1 and/or LDWD2 corresponding to dummy word lines (or word lines WL). The wires LDWL1 and/or LDWD2 may be implemented based on a process and a material similar to (or substantially identical to) those of the word lines WL and/or the dummy word lines. For example, the wire LDWL1 may be implemented the same or substantially the same as the wire LDWL of FIG. 2.

A length of the wire LDWL2 may be proportional to a length of one of the word lines WL and/or the dummy word lines. For example, a length of the wire LDWL2 may be x % (x being a positive number of 100 or less) of a length of one of the word lines WL and/or the dummy word lines. The wire LDWL2 may have a resistance corresponding to that of the word lines WL or the dummy word lines (e.g., proportional to a resistance thereof). For example, in example embodiments illustrated in FIG. 3D, the wire LDWL2 may have a resistance corresponding to "k/n" times the resistance of the word lines WL or the dummy word lines (k being an integer between 1 and m).

The wire LDWL1 and/or the wire LDWL2 may be electrically connected at a point in a data input/output circuit 140d. For example, in example embodiments illustrated in FIG. 3D, the wire LDWL1 and the wire LDWL2 may be electrically connected through a node N1 located in a k-th data input/output circuit 14k of the data input/output circuit 140d. LDWL wires are similar to the plurality of bit lines, but are identical to the plurality of word lines, which connect row decoder with memory cell array. LVR wires are identical to the power supply wire, which connect control logic with row decoder.

Unlike the inverter 201a of FIG. 3A, the inverter 201d of FIG. 3D may receive a signal DWL_TURN, not the signal DWL. The signal DWL_TURN may be a signal that is based on a resistance and a capacitance of the wire LDWL1, which corresponds to a length from a first data input/output circuit 141 to the k-th data input/output circuit 14k, and a resistance and a capacitance of the wire LDWL2, which corresponds to a length from the first data input/output circuit 141 to the k-th data input/output circuit 14k.

The inverter 201d may include transistors M1d and/or M2d. The transistor M1d may be implemented with a PMOS transistor, and the transistor M2d may be implemented with an NMOS transistor. The transistor M1d may include a first end (e.g., a source) to which the voltage VDD1 is applied, a gate to which the signal DWL_TURN is applied, and/or a second end (e.g., a drain) connected with a first end of the transistor M2d. The transistor M2d may include the first end (e.g., a drain) connected with the second end of the transistor M1d, a gate to which the signal DWL_TURN is applied, and/or a second end (e.g., a source) connected with the ground terminal through the resistors Rdvdda of the wire LVR. Each, or one or more, of the transistors M1d and M2d may be turned on and/or turned off in response to the signal DWL_TURN. In response to the signal DWL_TURN, the inverter 201d may output the signal DVDDA that is based on a capacitance of the wire LVC and a resistance of the wire LVR.

Figure 3E:
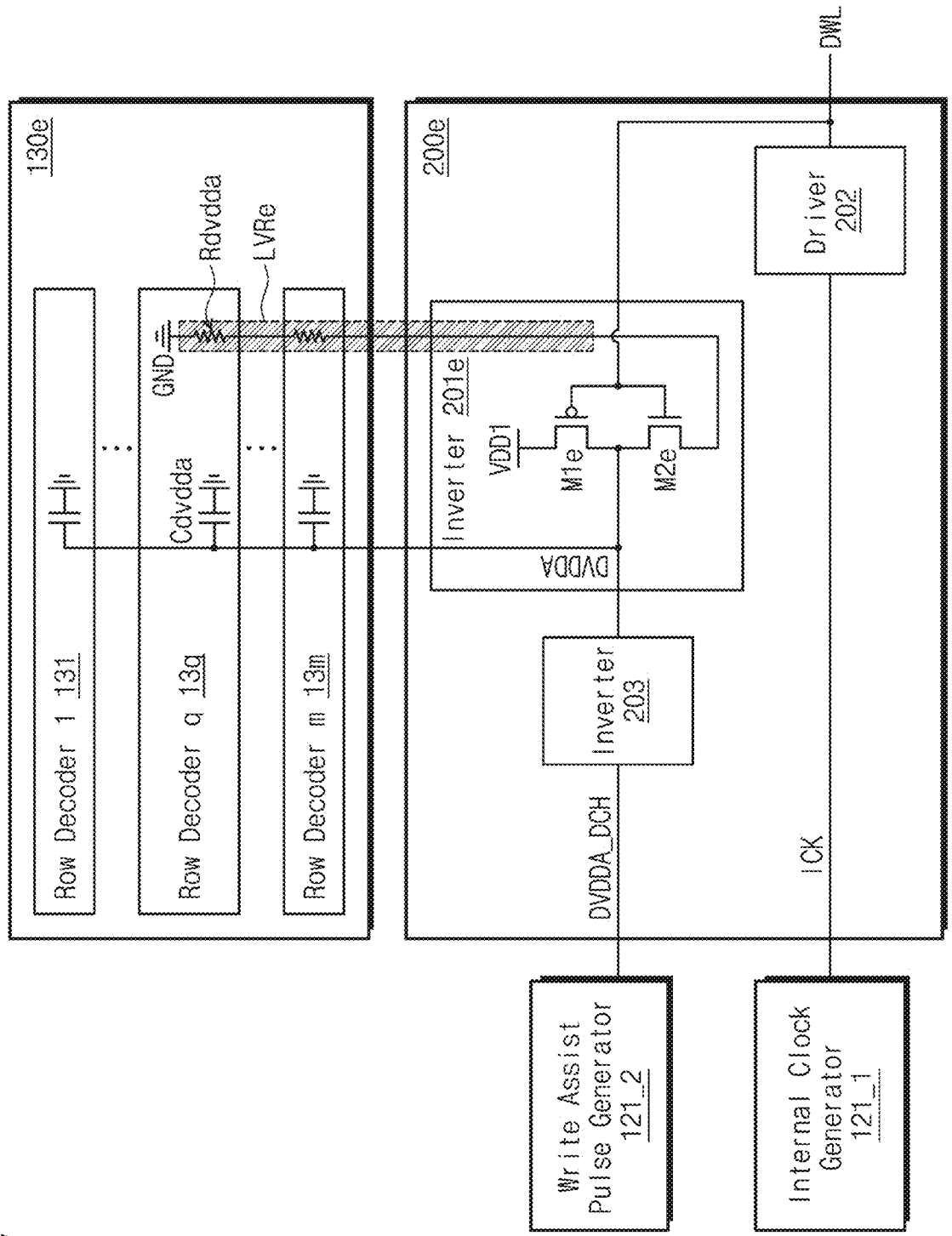
FIG. 3E illustrates a circuit diagram of a tracking circuit, according to some example embodiments of the present disclosure.

FIG. 3E illustrates a circuit diagram of a tracking circuit 200e, according to some example embodiments of the present disclosure. Referring to FIGS. 1, 2, 3A, and 3E, the tracking circuit 200e may include inverters 201e and/or 203 and/or the driver 202.

Unlike the inverter 201a of FIG. 3A, the inverter 201e of FIG. 3E may be connected with the ground terminal through the resistors Rdvdda of a wire LVRe. The wire LVRe may be implemented to be similar to the wire through which the power supply voltage is supplied to the memory cells CELL. For example, the wire LVRe may be implemented based on a process and a material similar to those of the wire through which the power supply voltage is supplied to the memory cells CELL. A length of the wire LVRe may be proportional to a length of the wire through which the power supply voltage is supplied to the memory cells CELL. For example, the length of the wire LVRe may be y % (y being a positive number of 100 or less) of the length of the wire through which the power supply voltage is supplied to the memory cells CELL. The wire LVRe may have a resistance corresponding to that of the wire through which the power supply voltage is supplied (e.g., proportional to a resistance thereof). In example embodiments illustrated in FIG. 3E, the wire LVRe may have a total resistance of resistors, which correspond to a length from an m-th row decoder 13m to a q-th row decoder 13q, from among the resistors Rdvdda included in the wire through which the power supply voltage is supplied. Here, "q" may be an integer between 1 and m. As such, a magnitude of a resistance of a second end of a transistor M2e may be variable.

The inverter 201e may include transistors M1e and/or M2e. The transistor M1e may be implemented with a PMOS transistor, and the transistor M2e may be implemented with an NMOS transistor. The transistor M1e may include a first end (e.g., a source) to which the voltage VDD1 is applied, a gate to which the signal DWL is applied, and/or a second end (e.g., a drain) connected with a first end of the transistor M2e. The transistor M2e may include the first end (e.g., a drain) connected with the second end of the transistor M1e, a gate to which the signal DWL is applied, and/or the second end (e.g., a source) connected with the ground terminal through the resistors Rdvdda of the wire LVRe. Each, or one or more, of the transistors M1e and M2e may be turned on and/or turned off in response to the signal DWL. In response to the signal DWL, the inverter 201e may output the signal DVDDA, based on the capacitors Cdvdda of the wire LVC and the resistors Rdvdda of the wire LVRe.

Figure 3F:
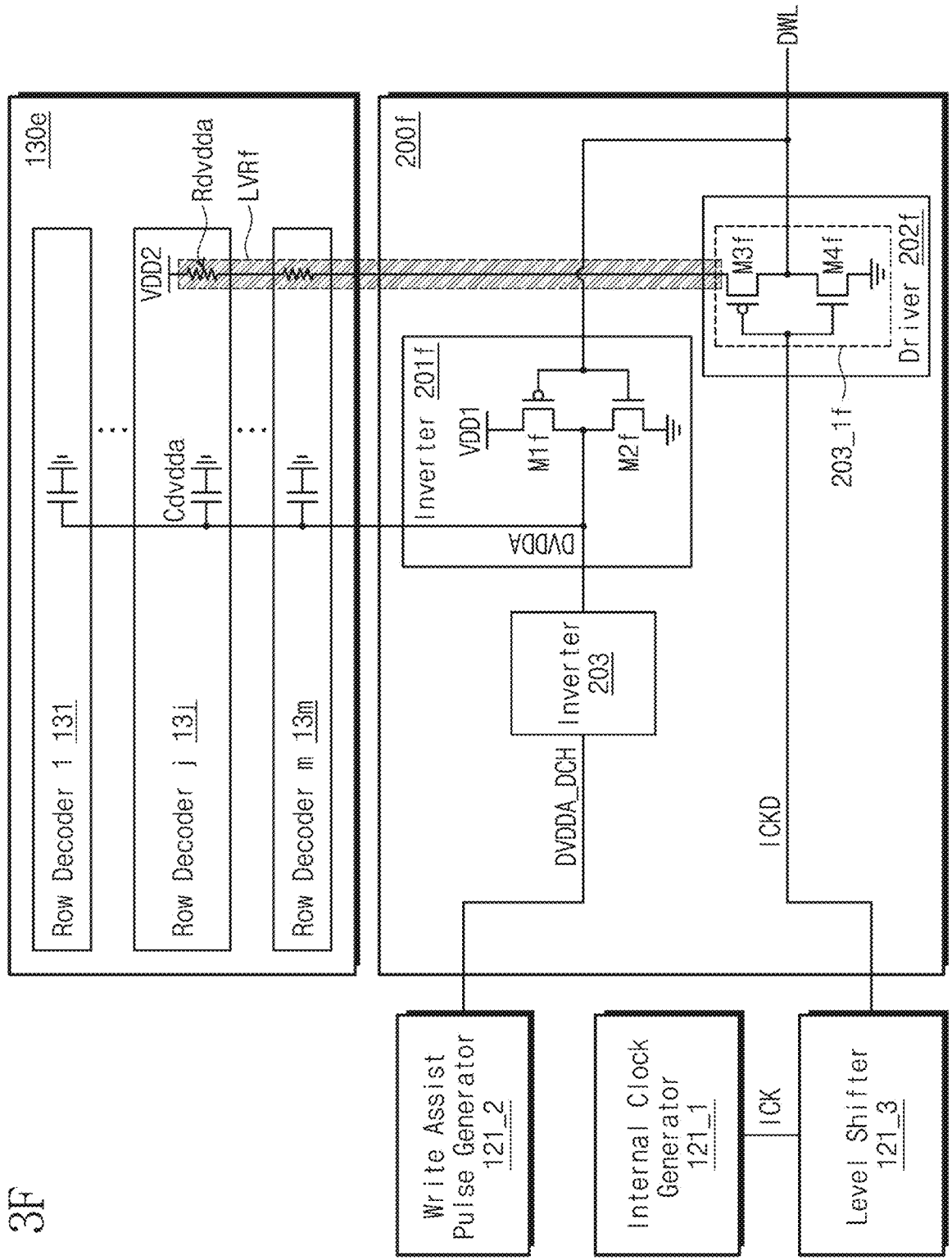
FIG. 3F illustrates a circuit diagram of a tracking circuit, according to some example embodiments of the present disclosure.

FIG. 3F illustrates a circuit diagram of a tracking circuit 200f, according to some example embodiments of the present disclosure. Referring to FIGS. 1, 2, 3A, and 3F, the tracking circuit 200f may include inverters 201f and/or 203 and/or a driver 202f.

In example embodiments of FIG. 3F, the control logic 120 may further include a level shifter 121_3. The level shifter 121_3 may adjust a level of the internal clock ICK. The level shifter 121_3 may generate an internal clock ICKD by adjusting a voltage level of the internal clock ICK. The level shifter 121_3 may output the internal clock ICKD to the driver 202f.

Unlike the transistor M2 of the inverter 201a of FIG. 3A, a transistor M2f of the inverter 201f of FIG. 3F may include one end (e.g., a source terminal) directly connected with the ground terminal. For example, the inverter 201f may include transistors MY and/or M2f. The transistor MY may be implemented with a PMOS transistor, and the transistor M2f may be implemented with an NMOS transistor. The transistor MY may include a first end (e.g., a source) to which the voltage VDD1 is applied, a gate to which the signal DWL is applied, and/or a second end (e.g., a drain) connected with a first end of the transistor M2f. The transistor M2f may include the first end (e.g., a drain) connected with the second end of the transistor M1f, a gate to which the signal DWL is applied, and/or the second end (e.g., a source) directly connected with the ground terminal. Each, or one or more, of the transistors MY and M2f may be turned on and/or turned off in response to the signal DWL. The inverter 201f may output the signal DVDDA that is based on the signal DWL and the capacitors Cdvdda.

The driver 202f may include an inverter 203_1f including transistors M3f and/or M4f. The transistor M3f may be implemented with a PMOS transistor, and the transistor M4f may be implemented with an NMOS transistor. The transistor M3f may include a first end (e.g., a source) to which a voltage VDD2 is applied through the resistors Rdvdda of a wire LVRf, a gate to which the internal clock ICKD is applied, and/or a second end (e.g., a drain) connected with a first end of the transistor M4f. The transistor M4f may include the first end (e.g., a drain) connected with the second end of the transistor M3f, a gate to which the internal clock ICKD is applied, and/or the second end (e.g., a source) connected with the ground terminal.

Unlike the driver 202a of FIG. 3A, the driver 202f of FIG. 3F may receive the voltage VDD2 through the resistors Rdvdda of the wire LVRf. The wire LVRf may be implemented to be similar to the wire through which the power supply voltage is supplied to the memory cells CELL. For example, the wire LVRf may be implemented based on a process and a material similar to those of the wire through which the power supply voltage is supplied to the memory cells CELL. A length of the wire LVRf may be proportional to a length of the wire through which the power supply voltage is supplied to the memory cells CELL. For example, the length of the wire LVRf may be z % (z being a positive number of 100 or less) of the length of the wire through which the power supply voltage is supplied to the memory cells CELL. The wire LVRf may have a resistance corresponding to that of the wire through which the power supply voltage is supplied (e.g., proportional to a resistance thereof). In example embodiments illustrated in FIG. 3F, the wire LVRf may have a total resistance of resistors, which correspond to a length from the m-th row decoder 13m to a j-th row decoder 13j, from among the resistors Rdvdda included in the wire through which the power supply voltage is supplied. Here, "j" may be an integer between 1 and m. The driver 202f may at least partially track the number of columns of the memory cell array 110, in response to that the voltage VDD2 drops through the wire LVRf.

Figure 3G:
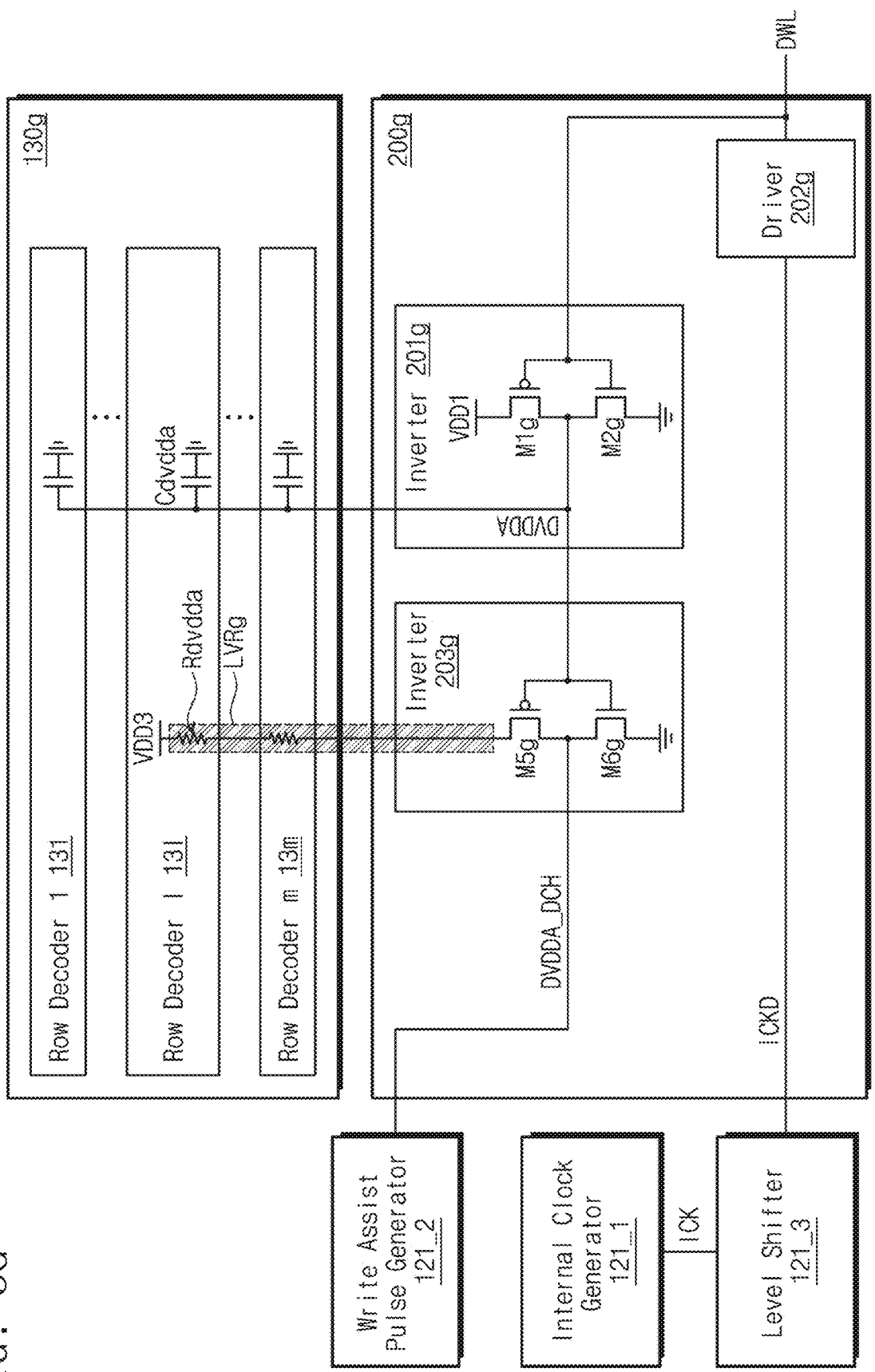
FIG. 3G illustrates a circuit diagram of a tracking circuit, according to some example embodiments of the present disclosure.

FIG. 3G illustrates a circuit diagram of a tracking circuit 200g, according to some example embodiments of the present disclosure. Referring to FIGS. 1, 2, 3A, and 3G, the tracking circuit 200g may include inverters 201g and 203g and/or a driver 202g.

Unlike the transistor M2 of the inverter 201a of FIG. 3A, a transistor M2g of the inverter 201g of FIG. 3G may include one end (e.g., a source terminal) directly connected with the ground terminal. For example, the inverter 201g may include transistors M1g and/or M2g. The transistor M1g may be implemented with a PMOS transistor, and the transistor M2g may be implemented with an NMOS transistor. The transistor M1g may include a first end (e.g., a source) to which the voltage VDD1 is applied, a gate to which the signal DWL is applied, and/or a second end (e.g., a drain) connected with a first end of the transistor M2g. The transistor M2g may include the first end (e.g., a drain)

connected with the second end of the transistor M1g, a gate to which the signal DWL is applied, and/or the second end (e.g., a source) directly connected with the ground terminal. Each, or one or more, of the transistors M1g and M2g may be turned on and/or turned off in response to the signal DWL. The inverter 201g may output the signal DVDDA that is based on the signal DWL and the capacitors Cdvdda.

In example embodiments of FIG. 3G, the control logic 120 may further include the level shifter 121_3. The driver 202g may receive the internal clock ICKD from the level shifter 121_3. The driver 202g may output the signal DWL in response to the internal clock ICKD, the capacitors CDWL, and the resistors RDWL.

The inverter 203g may include transistors M5g and/or M6g. The transistor M5g may be implemented as a PMOS transistor, and the transistor M6g may be implemented as an NMOS transistor.

The transistor M5g may include a first end (e.g., a source) to which a voltage VDD3 is applied through the resistors Rdvdda of a wire LVRg, a gate to which the signal DVDDA is applied, and/or a second end (e.g., a drain) connected with a first end of the transistor M6g. The transistor M6g may include the first end (e.g., a drain) connected with the second end of the transistor M5g, a gate to which the signal DVDDA is applied, and/or the second end (e.g., a source) directly connected with the ground terminal. Each, or one or more, of the transistors M5g and M6g may be turned on and/or turned off in response to the signal DVDDA. The inverter 203g may output the signal DVDDA_DCH that is based on the signal DVDDA and the resistors Rdvdda of the wire LVRg.

Unlike the inverter 203a of FIG. 3A, the inverter 203g of FIG. 3G may receive the voltage VDD3 through the resistors Rdvdda of the wire LVRg. The wire LVRg may be implemented to be similar to the wire through which the power supply voltage is supplied to the memory cells CELL. For example, the wire LVRg may be implemented based on a process and a material similar to those of the wire through which the power supply voltage is supplied to the memory cells CELL. A length of the wire LVRg may be proportional to a length of the wire through which the power supply voltage is supplied to the memory cells CELL. For example, the length of the wire LVRg may be w % (w being a positive number of 100 or less) of the length of the wire through which the power supply voltage is supplied to the memory cells CELL. The wire LVRg may have a resistance corresponding to that of the wire through which the power supply voltage is supplied (e.g., proportional to a resistance thereof). In example embodiments illustrated in FIG. 3G, the wire LVRg may have a total resistance of resistors, which correspond to a length from the m-th row decoder 13m to an 1-th row decoder 13l, from among the resistors Rdvdda included in the wire through which the power supply voltage is supplied. Here, "l" may be an integer between 1 and m. The inverter 203g may at least partially track the number of columns of the memory cell array 110, in response to that the voltage VDD3 drops through the wire LVRg.

In some example embodiments, the tracking circuit 200 may be implemented as example embodiments illustrated in FIGS. 3A to 3G or as a combination of two or more thereof. For example, the tracking circuit 200 may include the inverter 201a FIG. 3A, the inverter 203g of FIG. 3G, and the driver 202f of FIG. 3F. For another example, the tracking circuit 200 may include the inverter 201d and the driver 202d of FIG. 3D. In some example embodiments, as in the inverter 201b of FIG. 3B, the inverter 201d may further include an NMOS transistor(s) connected between the transistor M2d and the total resistance "R". Example embodiments are described above by way of example, and the present disclosure is not limited thereto.

FIG. 4 illustrates a timing diagram of signals generated by the control logic 120 of FIG. 2, according to some example embodiments of the present disclosure. Referring to FIGS. 1, 2, and 4, the control logic 120 may generate the internal clock ICK, the signals DWL, DVDDA, and DVDDA_DCH, and the write assist pulse ASEN, based on the clock CLK provided from the external device.

At time t1, the clock CLK may rise to logical high. The internal clock generator 121_1 of the control logic 120 may generate the internal clock ICK, based on the clock CLK. At time t2, the internal clock ICK may rise to logical high.

At time t3, in response to the internal clock ICK, a level of the signal DWL may start to increase, and a level of the signal DVDDA may start to decrease. For example, by the driver 202, the level of the signal DWL may start to increase in response to the internal clock ICK. By the inverter 201, the level of the signal DVDDA may start to decrease in response to the signal DWL.

A slope at which the level of the signal DWL increases or decreases may vary depending on the number of columns of the memory cell array 110. For example, as the number of columns of the memory cell array 110 decreases, a total capacitance of the capacitors CDWL and a total resistance of the resistors RDWL may decrease, and thus, a slope at which the signal DWL rises or falls may increase (e.g., slope SL1). In contrast, as the number of columns of the memory cell array 110 increases, a total capacitance of the capacitors CDWL and a total resistance of the resistors RDWL may increase, and thus, a slope at which the signal DWL rises or falls may decrease (e.g., slope SL2).

A slope at which the level of the signal DVDDA decreases may vary depending on the signal DWL and the number of rows of the memory cell array 110. For example, as the number of rows of the memory cell array 110 decreases, a total capacitance of the wire LVC and a total resistance of the wire LVR may decrease, and thus, a slope at which the signal DVDDA falls may increase (e.g., slope SL3). In contrast, as the number of rows of the memory cell array 110 increases, a total capacitance of the wire LVC and a total resistance of the wire LVR may increase, and thus, a slope at which the signal DVDDA falls may decrease (e.g., slope SL4).

At time t3, a level of the write assist pulse ASEN may start to increase. The write assist pulse ASEN may have a level corresponding to logical high during a given time. A width of the write assist pulse ASEN may be adjusted based on the level of the signal DVDDA_DCH. For example, the level of write assist pulse ASEN may decrease in response to that the level of the signal DVDDA_DCH increases.

At time t4, the level of the signal DVDDA_DCH may start to increase. A time at which the level of the signal DVDDA_DCH starts to increase may vary depending on the number of rows of the memory cell array 110. For example, as the number of rows of the memory cell array 110 decreases, a total capacitance of the wire LVC and a total resistance of the wire LVR may decrease, and thus, a time at which the signal DVDDA_DCH rises may quicken (e.g., slope SL5). In contrast, as the number of rows of the memory cell array 110 increases, a total capacitance of the wire LVC and a total resistance of the wire LVR may increase, and thus, a time at which the signal DVDDA_DCH rises may slow (e.g., slope SL6) (e.g., the signal DVDDA_DCH may start to rise at time t5).

The width of the write assist pulse ASEN may be varied by the number of columns of the memory cell array 110 and the number of rows of the memory cell array 110. For example, the ASEN pulse may begin to fall at a time t5 corresponding with a time at which the DVDDA_DCH rises to its peak. For example, as the number of columns of the memory cell array 110 and the number of rows of the memory cell array 110 decrease (or as a ratio of the number of rows to the number of columns decreases), a time at which the signal DVDDA_DCH rises may quicken, and thus, the width of the write assist pulse ASEN may become smaller (e.g., width W1). In contrast, as the number of rows of the memory cell array 110 increases (or as a ratio of the number of rows to the number of columns increases), a time at which the signal DVDDA_DCH rises may slow, and thus, the width of the write assist pulse ASEN may become greater (e.g., width W2).

As described with reference to FIGS. 2 to 4, through the tracking circuit 200, the control logic 120 may track the number of rows of the memory cell array 110 and the number of columns of the memory cell array 110. The control logic 120 may adjust the width of the write assist pulse ASEN, based on a tracking result. As the width of the write assist pulse ASEN becomes greater, a time period necessary to decrease a level of the power supply voltage supplied to the memory cells CELL of the memory cell array 110 may increase. The control logic 120 may optimize the width of the write assist pulse ASEN based on the number of rows of the memory cell array 110 and the number of columns of the memory cell array 110. For example, in response to tracking that the number of memory cells CELL of the memory cell array 110 is small (e.g., in response to tracking that the number of columns of the memory cell array 110 or the number of rows of the memory cell array 110 is small), the control logic 120 may decrease the width of the write assist pulse ASEN. As such, an unnecessary drop of the power supply voltage to be supplied to the memory cells CELL of the memory cell array 110 may be reduced or prevented (or may not occur). As a result, an unnecessary drop and power consumption necessary to recover the unnecessary drop may decrease, and the degradation of a write margin due to unnecessary time consuming may be reduced or prevented.

Figure 5:
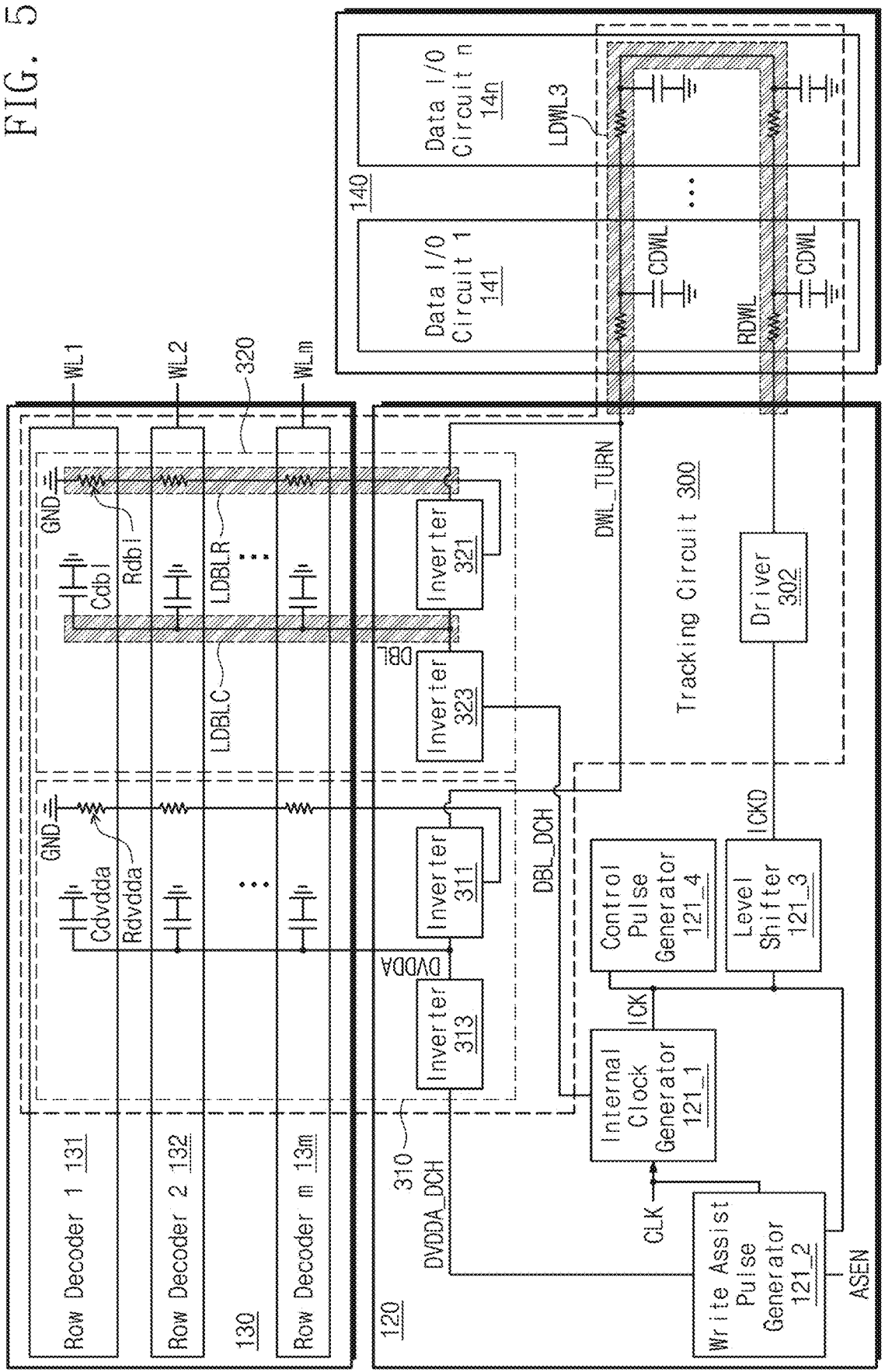
FIG. 5 illustrates control logic including a tracking circuit in more detail, according to some example embodiments of the present disclosure.

FIG. 5 illustrates the control logic 120 including a tracking circuit 300 in more detail, according to some example embodiments of the present disclosure. Referring to FIGS. 1 and 5, the control logic 120 of the memory device 100 may include the tracking circuit 300 instead of the tracking circuit 200, may include a driver 302 instead of the driver 202, and/or may further include the level shifter 121_3 and a control pulse generator 121_4.

The tracking circuit 300 may include a first tracking circuit 310, a second tracking circuit 320, a wire LDWL3, and/or the driver 302. The first tracking circuit 310 may include inverters 311 and/or 313, and/or the capacitors Cdvdda and/or the resistors Rdvdda for tracking the number of rows of the memory cell array 110. For convenience of illustration, the wires LVC and LVR are omitted.

A configuration and an operation of the inverter 311 may be similar to those of the inverter 201 of FIG. 2. A configuration and an operation of the inverter 313 may be similar to those of the inverter 203 of FIG. 2. For example, the inverter 311 may output the signal DVDDA to the inverter 313, in response to the signal DWL_TURN associated with the number of columns of the memory cell array 110, a total resistance of the resistors Rdvdda, and/or a total capacitance of the capacitors Cdvdda. In response to the signal DVDDA, the inverter 313 may output the signal DVDDA_DCH to the write assist pulse generator 121_2.

The first tracking circuit 310 may track the number of rows of the memory cell array 110 and/or the number of columns of the memory cell array 110 through the inverters 311 and/or 313. In response to a tracking result, the first tracking circuit 310 may generate the signal DVDDA_DCH. The write assist pulse generator 121_2 may generate the write assist pulse ASEN in response to the clock CLK, the internal clock ICK, and the signal DVDDA_DCH.

In some example embodiments, a configuration and an operation of the inverter 311 may be similar to those of the inverter 201b of FIG. 3B.

In some example embodiments, a configuration and an operation of the inverter 311 may be similar to those of the inverter 201g of FIG. 3G. A configuration and an operation of the inverter 313 may be similar to those of the inverter 203g of FIG. 3G.

In some example embodiments, a configuration and an operation of the inverter 311 may be similar to those of the inverter 201e of FIG. 3E.

The second tracking circuit 320 may include inverters 321 and/or 323, and/or wires LDBLC and/or LDBLR for tracking the number of rows of the memory cell array 110. In some example embodiments, the wires LDBLC and/or LDBLR may be implemented as dummy wires having a length corresponding to (e.g., substantially equal to) that of the bit lines BL and/or the dummy bit lines included in the memory cell array 110. For example, the wires LDBLC and/or LDBLR may be understood as a wire implemented by modeling the bit lines BL or the dummy bit lines. The wires LDBLC and/or LDBLR may be implemented to be similar to the bit lines BL and/or the dummy bit lines. For example, the wires LDBLC and/or LDBLR may be implemented based on a process and material similar to those of the bit lines BL and/or the dummy bit lines.

The wire LDBLC may include capacitors Cdbl. A total capacitance of the capacitors Cdbl (e.g., a total capacitance of the wire LDBLC) may be a self-capacitance of the wire LDBLC or a capacitance of the wire LDBLC and/or wires around the wire LDBLC. A total capacitance of the wire LDBLC may correspond to (e.g., may be substantially equal to) a self-capacitance of the bit lines BL and/or the dummy bit lines and/or a capacitance of the bit lines BL and/or the dummy bit lines and surrounding wires.

The wire LDBLR may include resistors Rdbl. A total resistance of the resistors Rdbl (e.g., a total resistance of the wire LDBLR) may correspond to (e.g., may be substantially equal to) a total resistance of the bit lines BL and/or the dummy bit lines.

In some example embodiments, the wires LDBLC and/or LDBLR may be located outside the memory cell array 110. For example, the wires LDBLC and LDBLR may be located in the row decoder 130.

In some example embodiments, unlike the example illustrated in FIG. 5, the wires LDBLC and/or LDBLR may be located in the memory cell array 110. For example, the wires LDBLC and/or LDBLR may be two of the dummy bit lines in the memory cell array 110.

The inverter 321 may output a signal DBL to the inverter 323, in response to the signal DWL_TURN associated with the number of columns of the memory cell array 110, a total resistance of the wire LDBLR, and/or a total capacitance of the wire LDBLC. In response to the signal DBL, the inverter 323 may output a signal DBL_DCH to the internal clock generator 121_1.

The second tracking circuit 320 may track the number of rows of the memory cell array 110 and/or the number of columns of the memory cell array 110 through the inverters 321 and/or 323. In response to a tracking result, the second tracking circuit 320 may generate the signal DBL_DCH. The internal clock generator 121_1 may adjust a width of the internal clock ICK, in response to the signal DBL_DCH.

The control pulse generator 121_4 may receive the internal clock ICK from the internal clock generator 121_1. The control pulse generator 121_4 may generate various control pulses (or control signals) for controlling the memory device 100 in response to the internal clock ICK. For example, the control pulse generator 121_4 may generate a pulse (e.g., WLEN of FIG. 7) for activating a specific word line and/or a sense amplifier enable pulse (e.g., SAE of FIG. 7) for controlling an operation of the data input/output circuit 140.

The driver 302 may track the number of columns of the memory cell array 110 through the wire LDWL3. The wire LDWL3 may be implemented based on a process and/or a material similar to (or substantially identical to) those of the word lines WL and/or the dummy word lines. A length of the wire LDWL3 may be proportional to a length of one of the word lines WL or the dummy word lines. For example, a length of the wire LDWL3 may be t % (t being a positive number of 100 or less) of a length of one of the word lines WL and/or the dummy word lines. The wire LDWL3 may have a resistance corresponding to that of the word lines WL and/or the dummy word lines (e.g., proportional to a resistance thereof). The wire LDWL3 may have a capacitance corresponding to that of the word lines WL and/or the dummy word lines (e.g., proportional to a capacitance thereof).

For example, in example embodiments illustrated in FIG. 5, a total resistance of the resistors RDWL of the wire LDWL3 may be about twice a resistance of the word lines WL and/or the dummy word lines. A total capacitance of capacitors CDWL of the wire LDWL3 may be about twice a capacitance of the word lines WL and/or the dummy word lines. In some example embodiments, the total resistance and/or the total capacitance of the wire LDWL3 may correspond to (e.g., may be proportional to) the number of columns of the memory cell array 110.

The driver 302 may provide the signal DWL_TURN, which are based on the total resistance and/or the total capacitance of the wire LDWL3, to the inverters 311 and/or 321 in response to the internal clock ICKD.

Unlike the example illustrated in FIG. 5, the inverters 311 and/or 321 may be directly connected with an output terminal of the driver 302. For example, as in the driver 202 and/or the inverter 201 of FIG. 2, the inverters 311 and/or 321 may be directly connected with the output terminal of the driver 302.

Unlike the example illustrated in FIG. 5, configurations and/or operations of the inverters 311 and/or 321 may be similar to those of the inverter 201d of FIG. 3D. The tracking circuit 300 may include the wires LDWL1 and/or LDWL2 of FIG. 3D instead of the wire LDWL3. A configuration and/or an operation of the driver 302 may be similar to those of the driver 202d of FIG. 3D.

In some example embodiments, a configuration and/or an operation of the driver 302 may be similar to those of the driver 202c of FIG. 3C.

In some example embodiments, the tracking circuit 300 may further include the wire LVRf of FIG. 3F. A configuration and/or an operation of the driver 302 may be similar to those of the driver 202f of FIG. 3F.

As the control logic 120 further includes the second tracking circuit 320, the control logic 120 may generate control pulses based on the number of rows of the memory cell array 110 and/or the number of columns of the memory cell array 110. As such, power consumption may be reduced in various operations of the memory device 100. For example, by using the wires LDBLC and LDBLR, the control logic 120 may further generate control pulses for the write operation or the read operation, based on a result of tracking the number of rows of the memory cell array 110 and the number of columns of the memory cell array 110. For example, based on the tracking result, the control logic 120 may generate control pulses for applying voltages to the bit lines BL and the complementary bit lines BLB. The control logic 120 may improve or optimize widths or timings of the control pulses depending on the size of the memory cell array 110. As the control pulses are optimized, power consumption may decrease in the write operation or the read operation, and a write margin or a read margin may be improved.

Figure 6A:
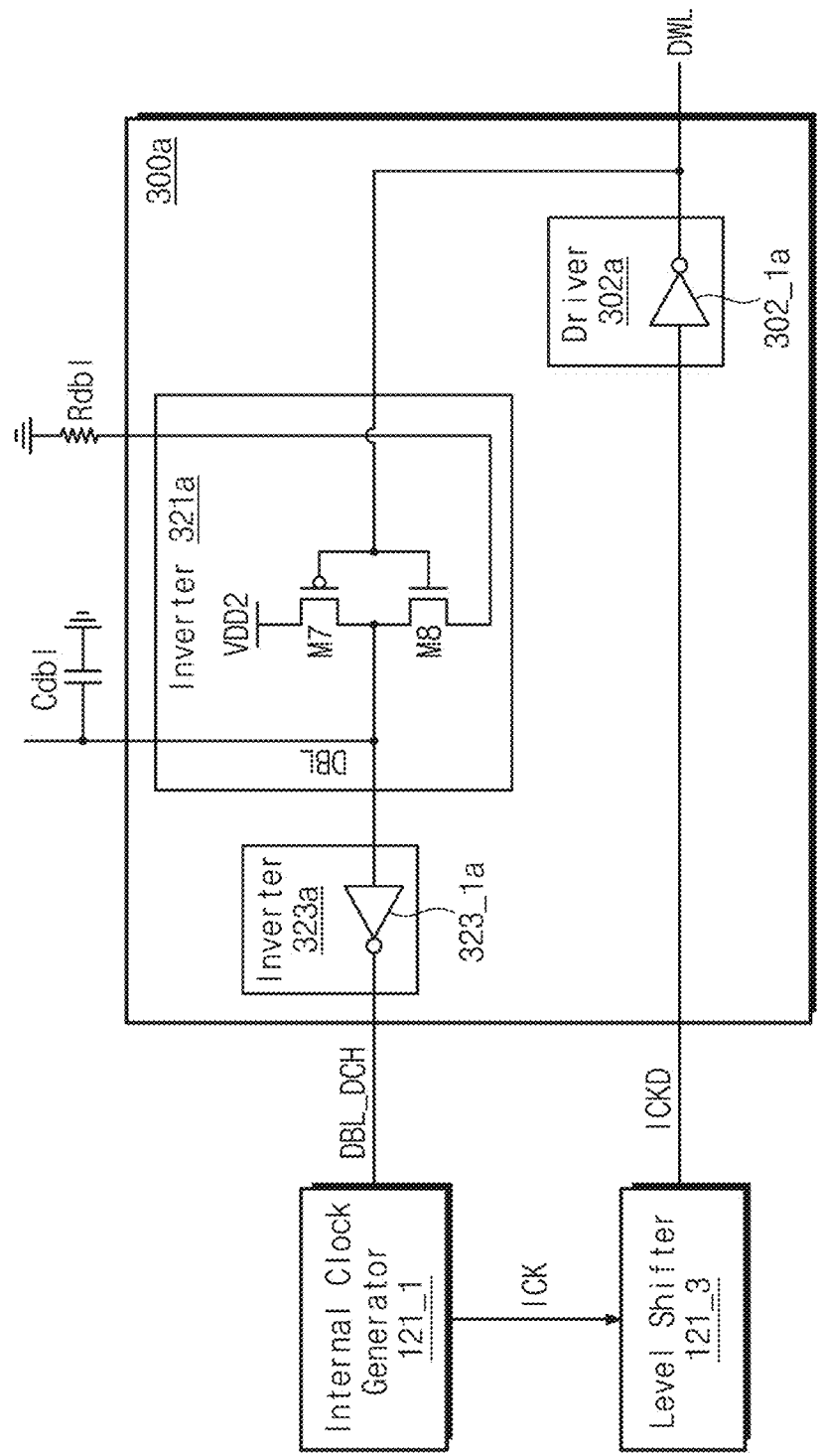
FIG. 6A illustrates a circuit diagram of a tracking circuit, according to some example embodiments of the present disclosure.

FIG. 6A illustrates a circuit diagram of a tracking circuit 300a, according to some example embodiments of the present disclosure. Referring to FIGS. 1, 5, and 6A, the tracking circuit 300a may include inverters 321a and/or 323a and/or a driver 302a. For convenience of illustration, the remaining components (e.g., the first tracking circuit 310 and the wires LDBLC and LDBLR) of the tracking circuit 300a are omitted. For convenience of illustration, an example in which the inverter 321a is directly connected with an output terminal of the driver 302a unlike the inverter 321 of FIG. 5 and receives the signal DWL instead of the signal DWL_TURN as in the inverter 201a of FIG. 3A is illustrated, but the present disclosure is not limited thereto.

The driver 302a may include an inverter 302_1a. The inverter 302_1a may include an input terminal of receiving the internal clock ICKD from the level shifter 121_3 and/or an output terminal of outputting the signal DWL. In response to the internal clock ICKD, the inverter 302_1a may output the signal DWL that is based on the capacitors CDWL and the resistors RDWL.

The inverter 321a may include transistors M7 and/or M8. The transistor M7 may be implemented as a PMOS transistor, and the transistor M8 may be implemented as an NMOS transistor. The transistor M7 may include a first end (e.g., a source) of receiving the voltage VDD2, a gate to which the signal DWL is applied, and/or a second end (e.g., a drain) connected with a first end of the transistor M8. The transistor M8 may include the first end (e.g., a drain) connected with the second end of the transistor M7, a gate to which the signal DWL is applied, and/or the second end (e.g., a source) connected with the resistors Rdbl of the wire LDBLR. The transistors M7 and/or M8 may be turned on and/or turned off in response to the signal DWL. In response to the signal DWL, the inverter 321a may output the signal DBL that is based on a total resistance of the wire LDBLR and/or a total capacitance of the wire LDBLC.

As the second end of the transistor M8 is connected with the ground terminal through the wire LDBLR, a resistance corresponding to that of a dummy bit line (and/or one of the bit lines BL) of the memory cell array 110 may be tracked by the inverter 321a. As the inverter 321a tracks not only a capacitance (e.g., a total capacitance of the capacitors Cdbl) but also a resistance corresponding to that of a dummy bit line, a width of the internal clock ICK generated by the internal clock generator 121_1 may be optimized based on the size of the memory cell array 110. As such, control pulses that are generated based on the internal clock ICK may also be optimized, and an unnecessary drop of a voltage applied to the memory cell array 110, the row decoder 130, or the data input/output circuit 140 for the purpose of an operation (e.g., a read operation or a write operation) of the memory device 100 may be reduced or prevented.

In some example embodiments, a configuration of the inverter 321a may be similar to that of the inverter 201b of FIG. 3B. For example, the inverter 321a may further include a stack (not illustrated) that is connected between the transistor M8 and the wire LDBLR. The stack may be connected with the second end of the transistor M8. The stack may include one NMOS transistor and/or two or more NMOS transistors connected in series. Each, or one or more, of the transistors of the stack may include a gate configured to receive the signal SLGH.

In some example embodiments, a configuration of the inverter 321a may be similar to that of the inverter 201e of FIG. 3E. For example, the transistor M7 of the inverter 321a may be connected with the ground terminal through a resistance corresponding to (e.g., substantially equal to) a length of a dummy bit line corresponding to a length from the m-th row decoder 13m to the q-th row decoder 13q, instead of the wire LDBLR.

The inverter 323a may include an inverter 323_1a. The inverter 323_1a may include an input terminal of receiving the signal DBL and an output terminal of outputting the signal DBL_DCH. The inverter 321_1a may the signal DBL_DCH by inverting (or delaying) the signal DBL.

In some example embodiments, a configuration of the inverter 323a may be similar to that of the inverter 203g of FIG. 3G. For example, the inverter 323_1a may include first and/or second transistors connected in series. The first transistor of the inverter 323_1a may be implemented as a PMOS transistor, and the second transistor of the inverter 323_1a may be implemented as an NMOS transistor. The first transistor of the inverter 323_1a may include a first end (e.g., a source) to which the voltage VDD3 is applied through a resistance corresponding to that of a dummy bit line corresponding to a length from the m-th row decoder 13m to the 1-th row decoder 131, a gate to which the signal DBL is applied, and/or a second end (e.g., a drain) connected with a first end of the second transistor of the inverter 323_1a. The second transistor of the inverter 323_1a may include the first end (e.g., a drain) connected with the second end of the second transistor of the inverter 323_1a, a gate to which the signal DBL is applied, and/or a second end (e.g., a source) connected with the ground terminal.

Figure 6B:
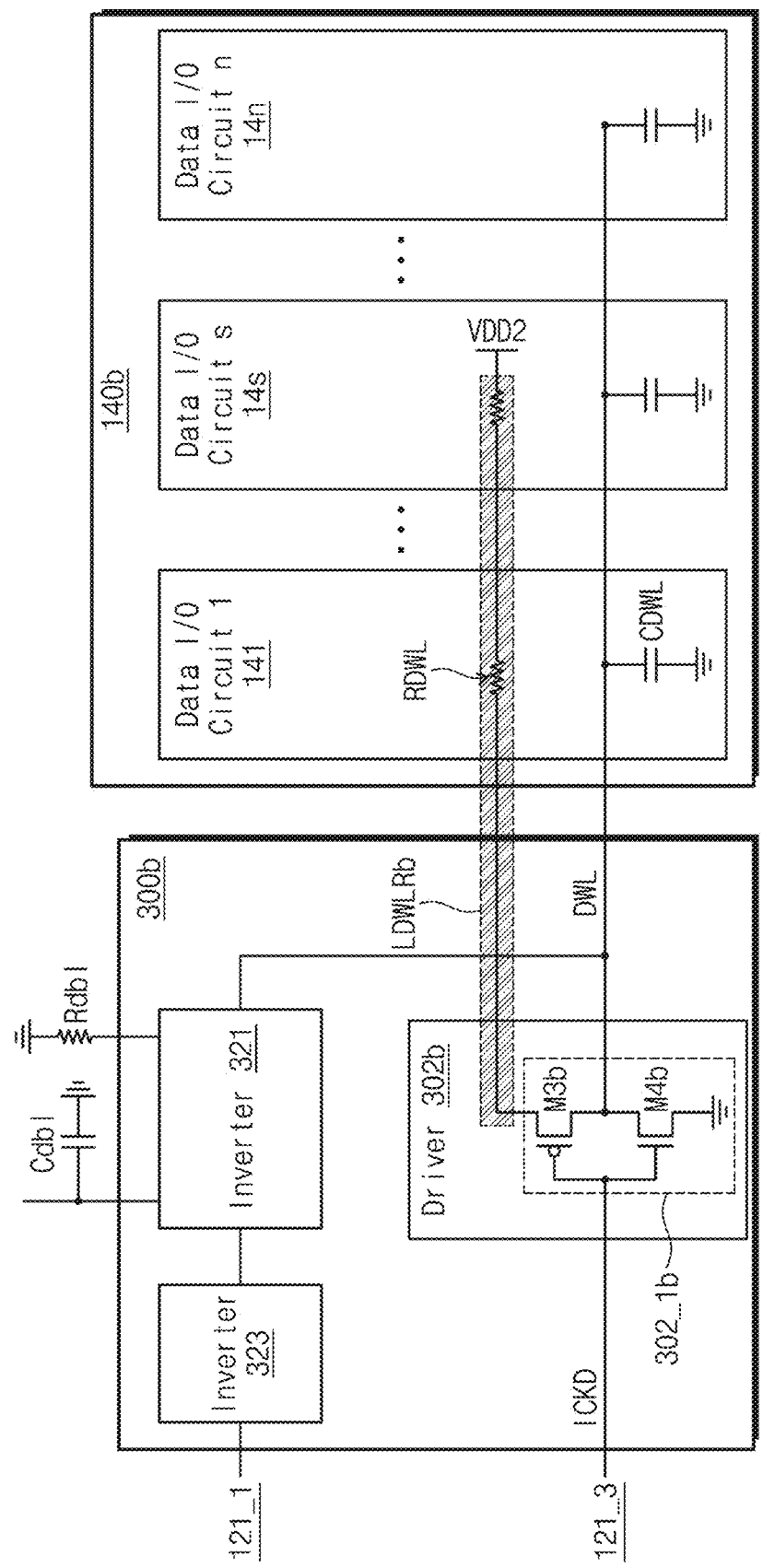
FIG. 6B illustrates a circuit diagram of a tracking circuit, according to some example embodiments of the present disclosure.

FIG. 6B illustrates a circuit diagram of a tracking circuit 300b, according to some example embodiments of the present disclosure. Referring to FIGS. 1, 5, 6A, and 6B, the tracking circuit 300b may include the inverters 321 and 323, a wire LDWLRb, and a driver 302b.

The wire LDWLRb may be implemented based on a process and a material similar to those of the word lines WL and/or the dummy word lines. A length of the wire LDWLRb may be proportional to a length of one of the word lines WL and/or the dummy word lines. For example, a length of the wire LDWLRb may be v % (v being a positive number of 100 or less) of a length of one of the word lines WL and/or the dummy word lines. The wire LDWLRb may have a resistance corresponding to that of the word lines WL or the dummy word lines (e.g., proportional to a resistance thereof). For example, in example embodiments illustrated in FIG. 6B, the wire LDWLRb may have a resistance corresponding to "s/n" times the resistance of the word lines WL or the dummy word lines. Here, "s" may be an integer between 1 and n. The driver 302b may include an inverter 302_1b including transistors M3b and M4b. The transistor M3b may be implemented as a PMOS transistor, and/or the transistor M4b may be implemented as an NMOS transistor. The transistor M3b may include a first end (e.g., a source) to which the voltage VDD2 is applied through the wire LDWLRb, a gate to which the internal clock ICKD is applied, and/or a second end (e.g., a drain) connected with a first end of the transistor M4b. The transistor M4b may include the first end (e.g., a drain) connected with the second end of the transistor M3b, a gate to which the internal clock ICKD is applied, and/or a second end (e.g., a source) connected with the ground terminal.

The driver 302b may track a length of a dummy word line (and/or a length of a memory string) corresponding to a length from the first data input/output circuit 141 to an s-th data input/output circuit 14s. The driver 302b may at least partially track the number of columns of the memory cell array 110, in response to that the voltage VDD2 drops through a total resistance of the wire LDWLRb.

Figure 6C:
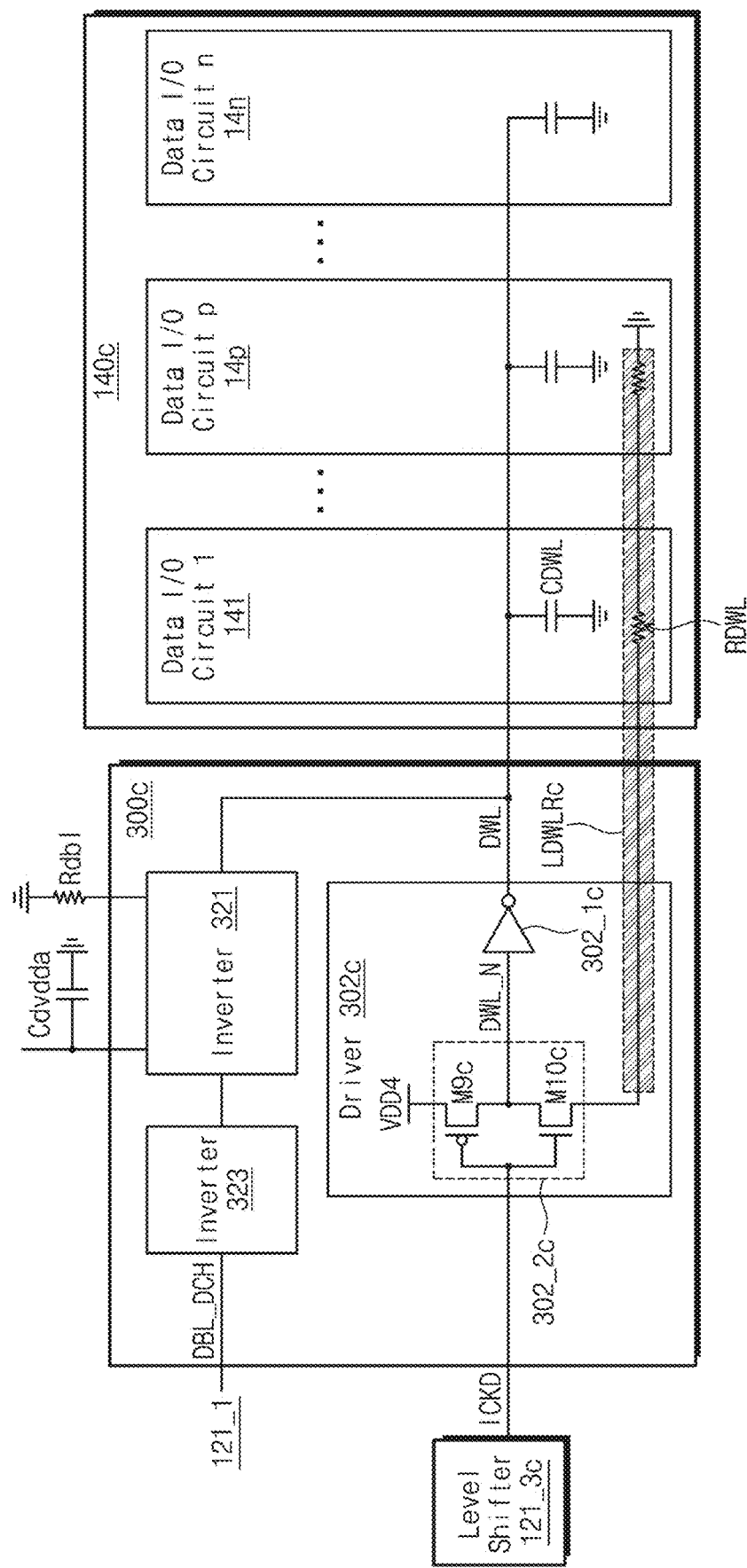
FIG. 6C illustrates a circuit diagram of a tracking circuit, according to some example embodiments of the present disclosure.

FIG. 6C illustrates a circuit diagram of a tracking circuit 300c, according to some example embodiments of the present disclosure. Referring to FIGS. 1, 5, 6A, and 6C, the tracking circuit 300b may include the inverters 321 and/or 323, a wire LDWLRc, and/or a driver 302c. The control logic 120 may include a level shifter 121_3c.

The level shifter 121_3c may adjust a level of the internal clock ICK generated from the internal clock generator 121_1. For example, the level shifter 121_3c may include two stages. The level shifter 121_3c may adjust a level of the internal clock ICK and may flip (or invert) a phase thereof. The level shifter 121_3c may output the internal clock ICKD.

The wire LDWLRc may be implemented based on a process and a material similar to those of the word lines WL and/or the dummy word lines. A length of the wire LDWLRc may be proportional to a length of one of the word lines WL and/or the dummy word lines. For example, a length of the wire LDWLRc may be u % (u being a positive number of 100 or less) of a length of one of the word lines WL and/or the dummy word lines. The wire LDWLRc may have a resistance corresponding to that of the word lines WL and/or the dummy word lines (e.g., proportional to a resistance thereof). For example, in example embodiments illustrated in FIG. 6C, the wire LDWLRc may have a resistance corresponding to "p/n" times the resistance of the word lines WL and/or the dummy word lines. Here, "p" may be an integer between 1 and n.

The driver 302c may include inverters 302_1c and/or 302_2c. The inverter 302_2c may receive the internal clock ICKD from the level shifter 121_3c. The inverter 302_2c may invert the internal clock ICKD. The inverter 302_2c may output a signal DWL_N being an inverted version of the internal clock ICKD.

The inverter 302_2c may include transistors M9c and/or M10c. The transistor M9c may be implemented as a PMOS transistor, and the transistor M10c may be implemented as an NMOS transistor. The transistor M9c may include a first end (e.g., a source) of receiving a voltage VDD4, a gate to which the internal clock ICKD is applied, and/or a second end (e.g., a drain) connected with a first end of the transistor M10c. The transistor M10c may include the first end (e.g., a drain) connected with the second end of the transistor M9c, a gate to which the internal clock ICKD is applied, and/or the second end (e.g., a source) connected with the ground terminal through the wire LDWLRc. The transistors M9c and/or M10c may be turned on and/or turned off in response to the internal clock ICKD.

The inverter 302_2c may track a length of a dummy word line (and/or a length of a memory string) corresponding to a length from the first data input/output circuit 141 to a p-th data input/output circuit 14p. The inverter 302_2c may at least partially track the number of columns of the memory cell array 110, based on a ground bounce of a voltage of the second end of the transistor M10c. Here, the ground bounce may be caused by a total resistance of the wire LDWLRc corresponding to a length from the s-th data input/output circuit 14p to the first data input/output circuit 141.

FIG. 7 illustrates a timing diagram of signals generated by the control logic 120 of FIG. 5, according to some example embodiments of the present disclosure. Referring to FIGS. 1, 5, and 7, the control logic 120 may generate the internal clock ICK, the signals DWL, DWL_TURN, DBL, and/or DBL_DCH, the word line enable pulse WLEN, and/or the sense amplifier enable pulse SAE, based on the clock CLK provided from the external device.

At time t7, the clock CLK may rise to logical high. The internal clock generator 121_1 of the control logic 120 may generate the internal clock ICK, based on the clock CLK. At time t8, the internal clock ICK may rise to logical high.

At time t9, in response to the internal clock ICK, a level of the signal DWL may start to increase, and a level of the word line enable pulse WLEN may start to decrease. For example, by the driver 302, the level of the signal DWL may start to increase in response to the internal clock ICK. As in the above description given with reference to FIG. 4, a slope at which the level of the signal DWL increases or decreases may vary depending on the number of columns of the memory cell array 110.

At time t10, a level of the signal DWL_TURN may start to increase in response to the signal DWL. A slope at which the level of the signal DWL_TURN increases may vary depending on the number of columns of the memory cell array 110. For example, as the number of columns of the memory cell array 110 decreases, a total capacitance of the wire LDWLVC and a total resistance of the wire LDWLVR may decrease, and thus, a slope at which the signal DWL_TURN rises or falls may increase (e.g., slope SL7). In contrast, as the number of columns of the memory cell array 110 increases, a total capacitance of the wire LDWLVC and a total resistance of the wire LDWLVR may increase, and thus, a slope at which the signal DWL_TURN rises or falls may decrease (e.g., slope SL8).

At time t11, a level of the signal DBL_DCH may start to increase in response to the fall of the signal DBL. Precisely, at time t11, during the fall of signal DBL, the signal DBL_DCH is triggered to begin rising. The internal clock ICK may fall in response to the increase of the level of the signal DBL_DCH.

A time at which the level of the signal DBL_DCH starts to increase may vary depending on the number of rows of the memory cell array 110. For example, as the number of rows of the memory cell array 110 decreases, a total capacitance and a total resistance of the wire LDBLC may decrease, and thus, a time at which the signal DBL_DCH rises may quicken (e.g., slope SL11). In contrast, as the number of rows of the memory cell array 110 increases, a total capacitance of the wire LDBLC and/or a total resistance of the wire LDBLR may increase, and thus, a time at which the signal DBL_DCH rises may slow (e.g., slope SL12) (e.g., the signal DBL_DCH may start to rise at time t15).

A width of the internal clock ICK may be varied by the number of columns of the memory cell array 110 and the number of rows of the memory cell array 110. For example, as the number of columns of the memory cell array 110 and the number of rows of the memory cell array 110 decrease (or as a ratio of the number of rows to the number of columns decreases), a time at which the signal DBL_DCH rises may quicken, and thus, the width of the internal clock ICK may become smaller (e.g., width W3). In contrast, as the number of rows of the memory cell array 110 increases (or as a ratio of the number of rows to the number of columns increases), a time at which the signal DBL_DCH rises may slow, and thus, the width of the internal clock ICK may become greater (e.g., width W4).

The word line enable pulse WLEN may fall in response to the fall of the internal clock ICK. For example, after a given delay time from a falling edge of the internal clock ICK, the word line enable pulse WLEN may fall. A width of the word line enable pulse WLEN may be determined based on the width of the internal clock ICK. For example, as the width of the internal clock ICK decreases, the width of the word line enable pulse WLEN may decrease (e.g., with W5). In contrast, as the width of the internal clock ICK increases, the width of the word line enable pulse WLEN may increase (e.g., with W6).

At time t12, the sense amplifier enable pulse SAE may rise. For example, the sense amplifier enable pulse SAE may be a signal that is obtained by delaying the signal DBL_DCH during a given time. As in the signal DBL_DCH, a time at which the sense amplifier enable pulse SAE starts to rise may vary depending on the number of rows of the memory cell array 110. For example, as the number of rows of the memory cell array 110 decreases, a time at which the sense amplifier enable pulse SAE rises may quicken (e.g., slope SL13). In contrast, as the number of rows of the memory cell array 110 increases, a time at which the sense amplifier enable pulse SAE rises may slow (e.g., slope SL14) (e.g., the sense amplifier enable pulse SAE may start to rise at time t14).

As described with reference to FIGS. 5 to 7, through the tracking circuit 300, the control logic 120 may track the number of rows of the memory cell array 110 and/or the number of columns of the memory cell array 110. Based on a tracking result, the control logic 120 may adjust a width of the internal clock ICK and/or may adjust timings of control pulses for controlling an operation of the memory device 100. A width of the sense amplifier enable pulse SAE may be adjusted based on the adjusted width of the internal clock ICK. A timing of the sense amplifier enable pulse SAE may be adjusted by the control logic 120.

The control logic 120 may optimize the width of the internal clock ICK and/or the timing of the sense amplifier enable pulse SAE based on the number of rows of the memory cell array 110 and/or the number of columns of the memory cell array 110. For example, in response to tracking that the number of memory cells CELL of the memory cell array 110 is small (e.g., in response to tracking that the number of columns of the memory cell array 110 or the number of rows of the memory cell array 110 is small and/or in response to tracking that a ratio of the number of rows of the memory cell array 110 to the number of columns of the memory cell array 110 is small), the control logic 120 may decrease the width of the internal clock ICK and/or may make a rising edge of the sense amplifier enable pulse SAE quicker. As such, a power and a time necessary for the read operation of the memory device 100 including the memory cell array 110 being relatively small may be reduced. As a result, a read margin of the memory device 100 may be improved.

Figure 8:
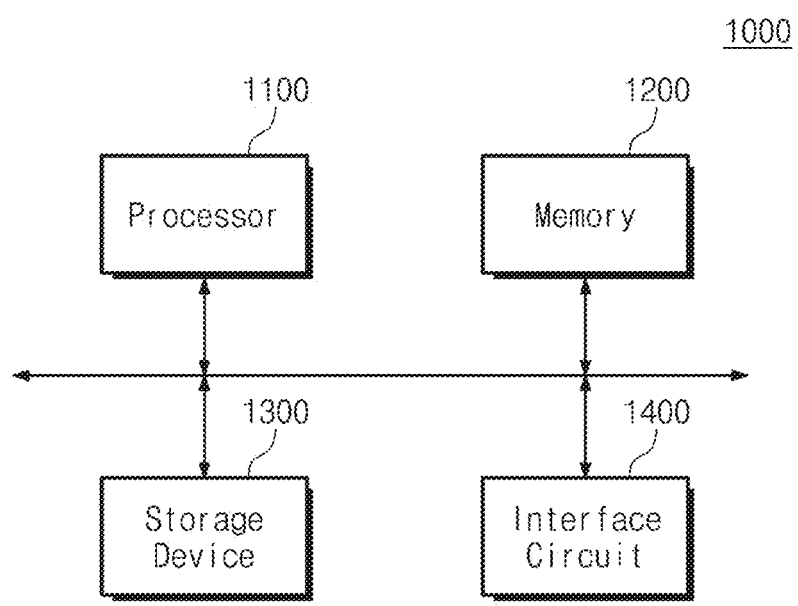
FIG. 8 illustrates a block diagram of an electronic device according, to some example embodiments of the present disclosure.

FIG. 8 illustrates a block diagram of an electronic device 1000, according to some example embodiments of the present disclosure. Referring to FIG. 8, the electronic device 1000 may include a processor 1100, a memory 1200, a storage device 1300, and/or an interface circuit 1400.

The processor 1100 may control overall operations of the electronic device 1000. The processor 1100 may execute a variety of software, firmware, and/or program codes loaded onto the memory 1200. The processor 1100 may function as a central processing unit of the electronic device 1000. The processor 1100 may include one or more processor cores.

The memory 1200 may store data and/or program codes that are processed by the processor 1100 and/or are scheduled to be processed by the processor 1100. For example, the software, firmware, program codes, and/or instructions to be executed by the processor 1100 may be loaded onto the memory 1200. The memory 1200 may function as a main memory device of the electronic device 1000. The memory 1200 may include a dynamic random access memory (DRAM), a static random access memory (SRAM), a phase-change random access memory (PRAM), a magnetic random access memory (MRAM), a ferroelectric random access memory (FeRAM), a resistive random access memory (RRAM), etc. The memory 1200 may be also referred to as a "buffer memory" or a "cache memory". Unlike the example illustrated in FIG. 8, the electronic device 1000 may include two or more memories 1200. Unlike the example illustrated in FIG. 8, the RAM 1200 may be implemented as an external device capable of communicating with the electronic device 1000.

In some example embodiments, the memory 1200 may include the memory device 100 of FIG. 1. For example, the memory 1200 may include the memory device 100 including the tracking circuit 200 of FIG. 2 and/or the memory device 100 including the tracking circuit 300 of FIG. 5. As such, as in the above manner given with reference to FIGS. 2 to 4 and 5 to 7, a size of a memory cell array included in the memory 1200 (and/or the number of rows of the memory cell array and number of columns of the memory cell array) may be tracked, and a write margin and a read margin of the memory 1200 may be improved based on a tracking result(s).

The storage device 1300 may store data generated by the processor 1100 for the purpose of long storage, a file to be driven by the processor 1100, and/or various software, firmware, program codes, and/or instructions executable by the processor 1100. The storage device 1300 may function as an auxiliary memory device of the electronic device 1000. The storage device 1300 may include a NAND flash memory, a NOR flash memory, etc. Unlike the example illustrated in FIG. 8, the electronic device 1000 may include two or more storage devices 1300. Unlike the example illustrated in FIG. 8, the storage device 1300 may be implemented as an external device capable of communicating with the electronic device 1000.

The interface circuit 1400 may communicate with an external device of the electronic device 1000 in various wired and/or wireless protocols. For example, under control of the processor 1100, the interface circuit 1400 may receive data from the external device and/or may transmit data stored in the memory 1200 or the storage device 1300 to the external device.

According to example embodiments of the present disclosure, control logic of an SRAM device may include a tracking circuit connected with metal lines for tracking the number of columns of a memory cell array and the number of rows of the memory cell array. By the tracking circuit, a length of word lines of the memory cell array and a length of bit lines of the memory cell array may be tracked. The control logic of the SRAM device may generate control pulses optimized for the size of the memory cell array, based on a tracking result(s) of the tracking circuit. Accordingly, a power and a time necessary for a write operation and a read operation may be reduced.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A memory device comprising:
a memory cell array including a plurality of static random access memory cells arranged in rows and columns;
a plurality of row decoders connected with the plurality of memory cells through a plurality of word lines;
a plurality of data input/output circuits connected with the plurality of memory cells through a plurality of bit lines; and
control logic including a clock generator configured to generate an internal clock and a tracking circuit configured to track a number of the rows and a number of the columns based on the internal clock,
wherein the tracking circuit includes:
a driver connected with a first wire including a first capacitor corresponding to a length of one of the plurality of word lines and a first resistor corresponding to the length of the one of the plurality of word lines, the driver configured to output a first signal based on a value of the first resistor and a capacitance of the first capacitor;
a first inverter including a first end connected with a second wire including a second resistor corresponding to a length of one of the plurality of bit lines and a second end connected with a third wire including a second capacitor corresponding to the length of the one of the plurality of bit lines, the first inverter configured to output a second signal based on a value of the second resistor, a capacitance of the second capacitor, and the first signal; and
a second inverter configured to output a third signal in response to the second signal,
wherein the second wire and the third wire are identical to a wire through which a power supply voltage is supplied to the plurality of memory cells.

2. The memory device of claim 1, wherein the first inverter includes a first transistor and a second transistor,
wherein the first transistor includes a first end configured to receive a first voltage, a gate configured to receive the first signal from the driver, and a second end connected with the second transistor,
wherein the second transistor includes a first end connected with the second end of the first transistor, a gate configured to receive the first signal from the driver, and a second end connected with a ground terminal through the second wire, and wherein the first transistor is a PMOS transistor, and the second transistor is an NMOS transistor.

3. The memory device of claim 1, wherein the driver includes a third inverter including an input terminal configured to receive the internal clock and an output terminal connected with the first wire and configured to output the first signal to the first inverter.

4. The memory device of claim 1, wherein the control logic further includes:
a write assist pulse generator configured to receive the third signal from the second inverter and to generate a write assist pulse in response to the third signal and the internal clock.

5. The memory device of claim 1, wherein the first inverter includes a first transistor, a second transistor, and a third transistor,
wherein the first transistor includes a first end configured to receive a first voltage, a gate configured to receive the first signal from the driver, and a second end connected with the second transistor,
wherein the second transistor includes a first end connected with the second end of the first transistor, a gate configured to receive the first signal from the driver, and a second end connected with the third transistor,
wherein the third transistor includes a first end connected with the second end of the second transistor, a gate configured to receive a fourth signal generated by the control logic, and a second end connected with a ground terminal through the second wire,
wherein the first transistor is a PMOS transistor, the second transistor is an NMOS transistor, and the third transistor is an NMOS transistor, and
wherein the fourth signal always corresponds to logical high.

6. The memory device of claim 1, wherein the driver includes a third inverter, a first transistor, and a second transistor,
wherein the third inverter includes an input terminal configured to receive the internal clock, and an output terminal connected with the first wire and configured to output the first signal,
wherein the first transistor includes a first end connected with the output terminal of the third inverter, a gate configured to receive a first control signal, and a second end connected with a ground terminal, and
wherein the second transistor includes a first end connected with the output terminal of the third inverter, a gate configured to receive a second control signal, and a second end connected with the ground terminal.

7. The memory device of claim 1, wherein the tracking circuit further includes a fourth wire electrically connected with the first wire at a first node,
wherein the first inverter includes an input terminal connected with an output terminal of the driver through the fourth wire and the first node,
wherein the fourth wire includes a resistance and a capacitance proportional to the length of the one of the plurality of bit lines,
wherein a length of the fourth wire is n % of a length of the memory cell array in a row direction, and
wherein the "n" is a positive integer of 100 or less.

8. The memory device of claim 1, wherein the first inverter is connected with a ground terminal through the second wire,
wherein a length of the second wire is n % of a length of the memory cell array in a column direction, and
wherein the "n" is a positive integer of 100 or less.

9. The memory device of claim 1, wherein the driver includes a third inverter including a first transistor and a second transistor,
wherein the first transistor includes a first end configured to receive a first voltage through a fourth wire, a gate configured to receive the internal clock, and a second terminal connected with the second transistor,
wherein the second transistor includes a first end connected with the second end of the first transistor, a gate configured to receive the internal clock, and a second end connected with a ground terminal,
wherein the fourth wire is similar to the plurality of bit lines,
wherein a length of the fourth wire is n % of a length of the memory cell array in a column direction,
wherein the "n" is a positive integer of 100 or less, and
wherein the first transistor is a PMOS transistor, and the second transistor is an NMOS transistor.

10. The memory device of claim 1, wherein the second inverter includes a first transistor and a second transistor,
wherein the first transistor includes a first end to which a first voltage is applied through a fourth wire, a gate to which the second signal is applied, and a second terminal connected with the second transistor,
wherein the second transistor includes a first end connected with the second end of the first transistor, a gate to which the second signal is applied, and a second end connected with a ground terminal,
wherein the fourth wire is similar to the plurality of bit lines,
wherein a length of the fourth wire is n % of a length of the memory cell array in a column direction,
wherein the "n" is a positive integer of 100 or less, and
wherein the first transistor is a PMOS transistor, and the second transistor is an NMOS transistor.

11. A memory device comprising:
a memory cell array including a plurality of static random access memory cells arranged in rows and columns;
a row decoder connected with the plurality of memory cells through a plurality of word lines;
a data input/output circuit connected with the plurality of memory cells through a plurality of bit lines; and
control logic including a clock generator configured to generate a first internal clock, a level shifter configured to generate a second internal clock by adjusting a level of the first internal clock, and a tracking circuit configured to track a number of the rows and a number of the columns based on the second internal clock,
wherein the tracking circuit includes:
a driver connected with a first wire, and configured to output a first signal based on the second internal clock, a resistance value of the first wire, and a capacitance of the first wire, the first wire having a length corresponding to a length of one of the plurality of word lines;
a first inverter including a first end connected with a second wire and a second end connected with a third wire, and configured to output a second signal based on a resistance value of the second wire, a capacitance of the third wire, and the first signal, the second wire having a length corresponding to a length of one of the plurality of bit lines, and the third wire having a length corresponding to the length of the one of the plurality of bit lines; and a second inverter configured to output a third signal in response to the second signal,
wherein the second wire and the third wire are identical to the plurality of bit lines connected with the plurality of memory cells.

12. The memory device of claim 11, wherein the clock generator is configured to adjust a width of the first internal clock in response to the third signal.

13. The memory device of claim 12, wherein the control logic further includes a control pulse generator, and
wherein, based on the width of the first internal clock, the control pulse generator is configured to generate a word line enable pulse to be applied to the plurality of word lines and a sense amplifier enable pulse for sensing data stored in the memory cell array.

14. The memory device of claim 11, wherein the first inverter includes a first transistor and a second transistor,
wherein the first transistor includes a first end to which a first voltage is applied, a gate configured to receive the first signal, and a second end connected with the second transistor,
wherein the second transistor includes a first end connected with the second end of the first transistor, a gate configured to receive the first signal, and a second end connected with a ground terminal through the second wire, and
wherein the second end of the first transistor and the first end of the second transistor are connected with the third wire.

15. The memory device of claim 11, wherein the driver includes a third inverter including an input terminal configured to receive the second internal clock, an output terminal configured to output the first signal, a first transistor, and a second transistor,
wherein the first transistor includes a first end configured to receive a first voltage through a fourth wire, a gate configured to receive the second internal clock, and a second terminal connected with the second transistor,
wherein the second transistor includes a first end connected with the second end of the first transistor, a gate configured to receive the second internal clock, and a second end connected with a ground terminal,
wherein the second end of the first transistor and the first end of the second transistor are connected with the first wire,
wherein the fourth wire is identical to the plurality of word lines,
wherein a length of the fourth wire is n % of the length of the one of the plurality of word lines, and
wherein the "n" is a positive integer of 100 or less.

16. The memory device of claim 11, wherein the level shifter is configured to generate the second internal clock by further adjusting a phase of the first internal clock,
wherein the driver includes a third inverter, and a fourth inverter, the third inverter including a first transistor and a second transistor,
wherein the first transistor includes a first end configured to receive a first voltage, a gate configured to receive the second internal clock, and a second end connected with the second transistor,
wherein the second transistor includes a first end connected with the second end of the first transistor, a gate configured to receive the second internal clock, and a second end connected with a ground terminal through a fourth wire,
wherein the fourth inverter includes an input terminal connected with the second end of the first transistor and an output terminal connected with the first wire and configured to output the first signal,
wherein the fourth wire is identical to the plurality of word lines,
wherein a length of the fourth wire is n % of the length of the one of the plurality of word lines, and
wherein the "n" is a positive integer of 100 or less.

17. A static random access memory (SRAM) device comprising:
a memory cell array including a plurality of memory cells arranged in rows and columns, wherein each of the plurality of memory cells is connected with one of a plurality of word lines and one of a plurality of bit lines; and
control logic including a clock generator configured to generate a first internal clock, a first tracking circuit configured to track a number of the rows and a number of the columns based on the first internal clock and to generate a first signal, and a second tracking circuit configured to track the number of the rows and the number of the columns based on the first internal clock and to generate a second signal,
wherein the first tracking circuit includes:
a first wire including a first capacitor corresponding to a length of the memory cells in a column direction;
a second wire including a first resistor corresponding to the length of the memory cells in the column direction; and
a third wire including a second capacitor and a second resistor each corresponding to a length of the memory cells in a row direction,
wherein the first wire and the second wire are identical to a wire through which a power supply voltage is supplied to the plurality of memory cells, and
wherein the control logic is configured to
generate a pulse for controlling a write operation of the SRAM device based on the first signal, and
generate a pulse for controlling a read operation of the SRAM device based on the second signal.

18. The SRAM device of claim 17, wherein the second tracking circuit includes:
a fourth wire including a third capacitor corresponding to the length of the memory cells in the column direction; and
a fifth wire including a third resistor corresponding to the length of the memory cells in the column direction, and
wherein the fourth wire and the fifth wire are identical to the plurality of bit lines.

19. The SRAM device of claim 17, wherein the first tracking circuit includes:
a driver configured to receive the first internal clock and to output a third signal based on the second capacitor and the second resistor;
a first inverter configured to output a fourth signal based on the first capacitor and the first resistor, in response to the third signal; and
a second inverter configured to output the first signal in response to the fourth signal.

20. The SRAM device of claim 17, wherein the control logic further includes a level shifter configured to generate a second internal clock by adjusting a level of the first internal clock, and
wherein the second tracking circuit includes:
a fourth wire including a third capacitor corresponding to the length of the memory cells in the column direction;
a fifth wire including a third resistor corresponding to the length of the memory cells in the column direction;

a driver connected with the third wire, and configured to receive the second internal clock and to output a third signal based on the second capacitor and the second resistor;

a first inverter connected with the fourth wire and the fifth wire, and configured to output a fourth signal based on the third signal, the third capacitor, and the third resistor; and a second inverter configured to output the second signal in response to the fourth signal.

* * * * *